US009786494B2

(12) United States Patent
Kumagai et al.

(10) Patent No.: US 9,786,494 B2
(45) Date of Patent: Oct. 10, 2017

(54) FILM FORMATION METHOD AND FILM FORMATION APPARATUS

(71) Applicants: Tokyo Electron Limited, Tokyo (JP); L'AIR LIQUIDE SOCIETE ANONYME POUR L'ETUDE ET L'EXPLOITATION DES PROCEDES GEORGES CLAUDE, Paris (FR)

(72) Inventors: Yasunori Kumagai, Iwate (JP); Kohei Tarutani, Tokyo (JP); Takashi Kameoka, Tokyo (JP); Tomoko Yanagita, Tokyo (JP); Ryohei Matsui, Tokyo (JP)

(73) Assignees: TOKYO ELECTRON LIMITED, Tokyo (JP); L'AIR LIQUIDE SOCIETE ANONYME POUR L'ETUDE ET L'EXPLOITATION DES PROCEDES GEORGES CLAUDE, Paris (FR)

( * ) Notice: Subject to any disclaimer, the term of this patent is extended or adjusted under 35 U.S.C. 154(b) by 139 days.

(21) Appl. No.: 14/463,735

(22) Filed: Aug. 20, 2014

(65) Prior Publication Data
US 2015/0064931 A1 Mar. 5, 2015

(30) Foreign Application Priority Data

Sep. 2, 2013 (JP) ................................. 2013-181383

(51) Int. Cl.
*H01L 21/02* (2006.01)

(52) U.S. Cl.
CPC .. *H01L 21/02312* (2013.01); *H01L 21/02118* (2013.01); *H01L 21/02271* (2013.01)

(58) Field of Classification Search
CPC ......... C23C 14/12; C23C 14/24; C23C 14/54; C23C 14/542; C23C 14/543; C23C 16/4481; C23C 16/45561; C23C 16/52; C23C 16/02; C23C 16/22; C23C 16/4405; H01L 21/02118; H01L 21/02271;
(Continued)

(56) References Cited

U.S. PATENT DOCUMENTS 3,542,814 A * 11/1970 Greco ..................... C07C 51/56
549/239
4,225,702 A * 9/1980 Makino .................. H01B 3/303
528/125

(Continued)

FOREIGN PATENT DOCUMENTS

| JP | H10-092800 | 4/1998 |
| JP | 4283910 | 6/2009 |
| JP | 2010040695 A * | 2/2010 |

*Primary Examiner* — Sophia Nguyen
(74) *Attorney, Agent, or Firm* — IPUSA, PLLC

(57) ABSTRACT

Disclosed is a film formation method, including vaporizing a plurality of raw material monomers in respective corresponding vaporizers, supplying the plurality of raw material monomers into a film formation apparatus, causing vapor deposition polymerization of the plurality of raw material monomers in the film formation apparatus to form an organic film on a substrate, and removing an impurity contained in at least one raw material monomer among the plurality of raw material monomers before the vapor deposition polymerization.

8 Claims, 14 Drawing Sheets

(58) Field of Classification Search
CPC ......... H01L 21/02312; H01L 21/02263; H01L 21/02304; B05D 1/60
See application file for complete search history.

(56) References Cited

U.S. PATENT DOCUMENTS

| | | | | |
|---|---|---|---|---|
| 4,269,968 | A * | 5/1981 | Duran | C08G 73/1028 528/125 |
| 4,376,195 | A * | 3/1983 | Lee | C08G 73/1028 528/188 |
| 4,670,535 | A * | 6/1987 | Sugio | G03F 7/0387 430/283.1 |
| 4,845,181 | A * | 7/1989 | Kool | C08G 18/00 528/354 |
| 4,906,760 | A * | 3/1990 | Mueller | C07C 51/573 549/233 |
| 5,066,770 | A * | 11/1991 | Noguchi | C08G 73/1028 526/85 |
| 5,310,863 | A * | 5/1994 | Sachdev | C08G 73/1014 428/473.5 |
| 6,476,238 | B1 * | 11/2002 | Chu | C07C 51/265 549/299 |
| 9,349,584 | B2 * | 5/2016 | Sugita | H01L 21/02118 |
| 2001/0027031 | A1 * | 10/2001 | Hasebe | C23C 16/0272 438/785 |
| 2003/0010288 | A1 * | 1/2003 | Yamazaki | C23C 14/042 118/715 |
| 2003/0030193 | A1 * | 2/2003 | Soeda | B01D 1/0023 266/171 |
| 2003/0180457 | A1 * | 9/2003 | Murakami | C23C 14/12 427/237 |
| 2004/0052618 | A1 * | 3/2004 | Matsunaga | H01L 21/67757 414/217 |
| 2004/0077249 | A1 * | 4/2004 | Saito | B01J 19/088 445/24 |
| 2004/0216673 | A1 * | 11/2004 | Sakata | C23C 14/12 118/719 |
| 2006/0258823 | A1 * | 11/2006 | Endo | C07C 41/03 525/531 |
| 2007/0021622 | A1 * | 1/2007 | Ogawa | C07C 51/56 549/235 |
| 2007/0087130 | A1 * | 4/2007 | Arai | C23C 14/04 427/457 |
| 2007/0130996 | A1 * | 6/2007 | Ouellet | C23C 16/0272 65/384 |
| 2007/0186852 | A1 * | 8/2007 | Sakata | C23C 14/12 118/719 |
| 2009/0232967 | A1 * | 9/2009 | Takenaga | C23C 16/402 427/9 |
| 2010/0098517 | A1 * | 4/2010 | Hishiya | H01L 21/67775 414/160 |
| 2010/0210082 | A1 * | 8/2010 | Nakamura | H01L 21/02175 438/253 |
| 2010/0255198 | A1 * | 10/2010 | Cleary | C23C 16/4402 427/255.39 |
| 2011/0023784 | A1 * | 2/2011 | Kashiwagi | B05D 1/60 118/726 |
| 2011/0039420 | A1 * | 2/2011 | Nakao | B05D 1/60 438/781 |
| 2011/0045182 | A1 * | 2/2011 | Fukumori | C23C 16/4412 427/248.1 |
| 2011/0136302 | A1 * | 6/2011 | Yamazaki | H01L 21/28176 438/156 |
| 2012/0135239 | A1 * | 5/2012 | Hayashi | C23C 14/12 428/402 |
| 2012/0180719 | A1 * | 7/2012 | Inoue | C23C 16/4481 118/708 |
| 2012/0192793 | A1 * | 8/2012 | Fukumori | C23C 16/4412 118/724 |
| 2012/0240858 | A1 * | 9/2012 | Taniyama | H01L 21/67017 118/726 |
| 2012/0269970 | A1 * | 10/2012 | Ido | C23C 16/02 427/255.394 |
| 2013/0008381 | A1 * | 1/2013 | Fukumori | B01D 8/00 118/715 |
| 2013/0068163 | A1 * | 3/2013 | Yamaguchi | H01L 21/02118 118/725 |
| 2013/0072029 | A1 * | 3/2013 | Yamaguchi | H01L 21/0271 438/780 |
| 2013/0126860 | A1 * | 5/2013 | Fukuda | C08L 79/08 257/43 |
| 2013/0164629 | A1 * | 6/2013 | Hou | D01F 6/74 429/249 |
| 2013/0178597 | A1 * | 7/2013 | Takasawa | C09D 179/08 528/346 |
| 2013/0289204 | A1 * | 10/2013 | Kanazawa | C08J 3/14 524/606 |
| 2014/0038424 | A1 * | 2/2014 | Horikawa | H01L 21/02118 438/759 |
| 2014/0064885 | A1 * | 3/2014 | Oyama | H01L 21/67373 414/160 |
| 2014/0097375 | A1 * | 4/2014 | Ho | C08G 73/1039 252/62.2 |
| 2014/0145160 | A1 * | 5/2014 | Cho | H01L 51/5268 257/40 |
| 2014/0209022 | A1 * | 7/2014 | Inoue | G05D 16/00 118/712 |
| 2014/0315012 | A1 * | 10/2014 | Iroh | C08K 3/04 428/323 |
| 2015/0064931 | A1 * | 3/2015 | Kumagai | H01L 21/02312 438/780 |
| 2015/0337436 | A1 * | 11/2015 | Gregg | C23C 16/4481 427/569 |
| 2016/0035999 | A1 * | 2/2016 | Ii | H01L 51/5253 257/40 |
| 2016/0049611 | A1 * | 2/2016 | Yamada | H01L 51/5253 257/40 |
| 2016/0076149 | A1 * | 3/2016 | Yamazaki | C23C 16/4401 438/758 |
| 2016/0083834 | A1 * | 3/2016 | Yamazaki | C23C 14/24 427/248.1 |
| 2016/0214991 | A1 * | 7/2016 | Tarutani | C07D 493/04 |

* cited by examiner

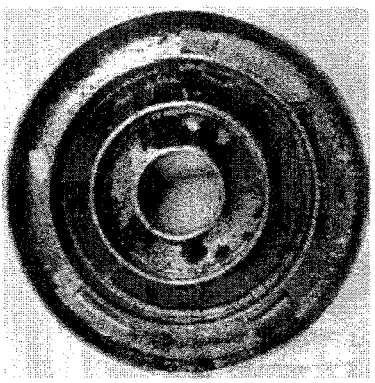
FIG.8D TRAY 4
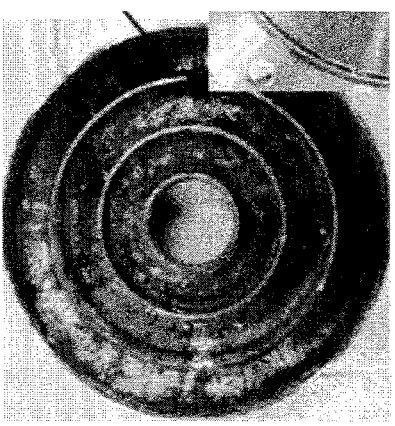
FIG.8H TRAY 8 (TOP)
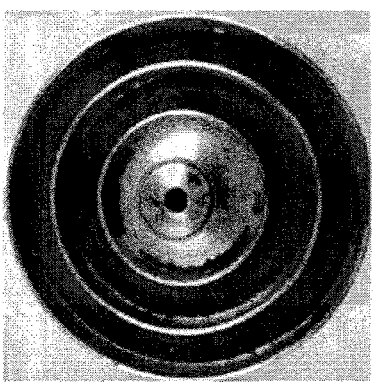
FIG.8C TRAY 3
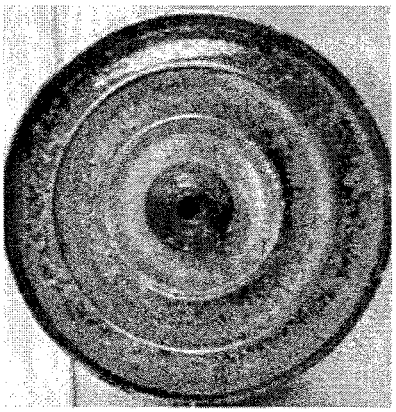
FIG.8G TRAY 7
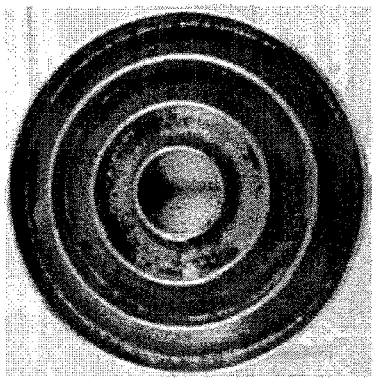
FIG.8B TRAY 2
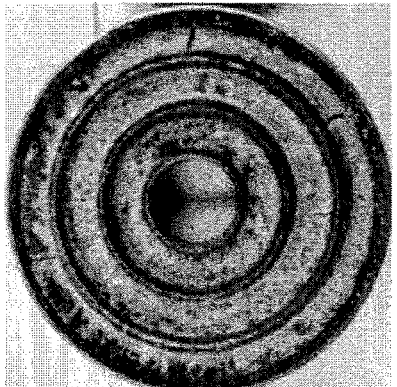
FIG.8F TRAY 6
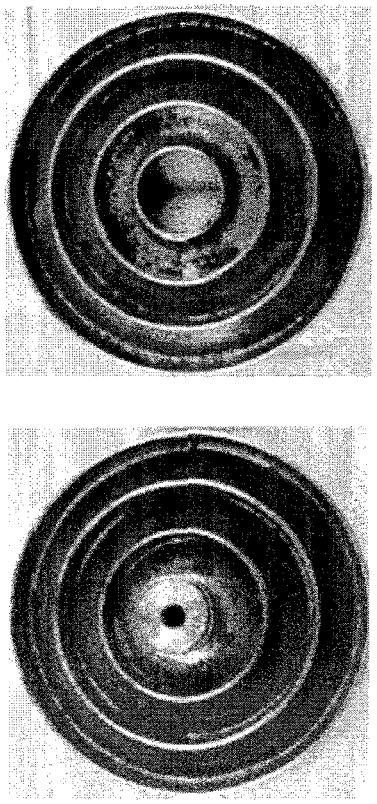
FIG.8A TRAY 1 (BOTTOM)
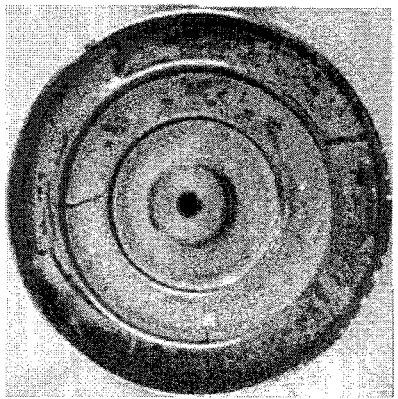
FIG.8E TRAY 5

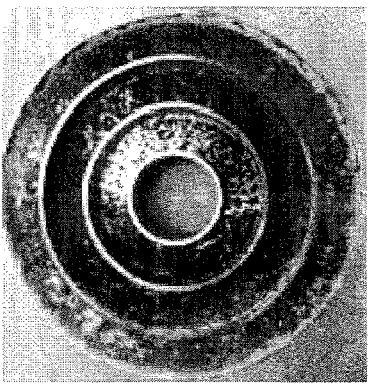
FIG.9D TRAY 4
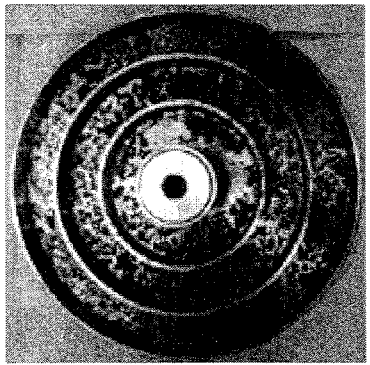
FIG.9C TRAY 3
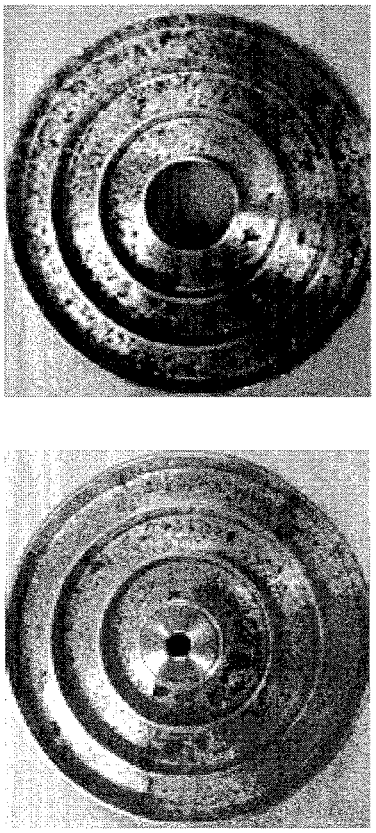
FIG.9B TRAY 2
FIG.9A TRAY 1 (BOTTOM)
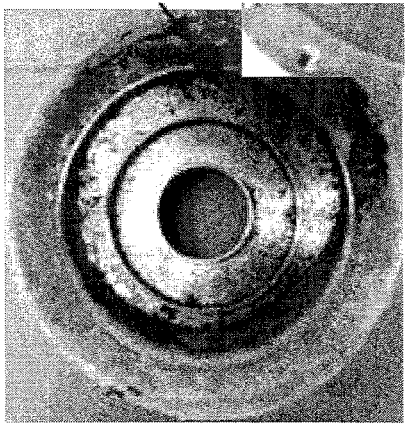
FIG.9H TRAY 8 (TOP)
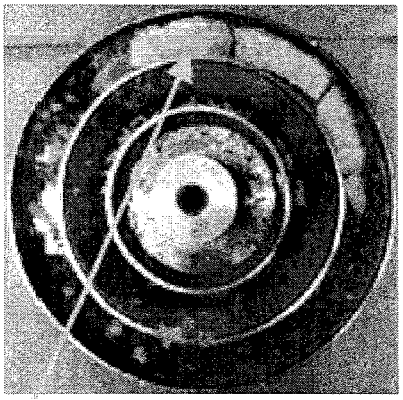
FIG.9G TRAY 7
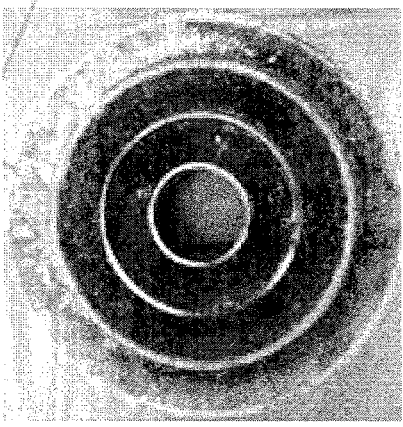
FIG.9F TRAY 6
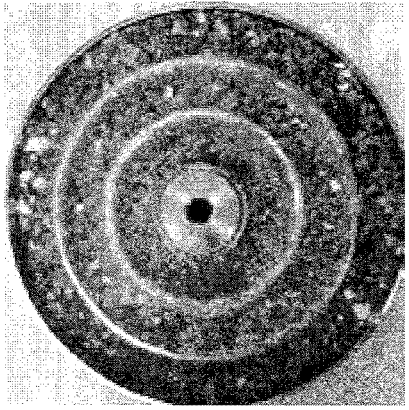
FIG.9E TRAY 5

FILM FORMATION METHOD AND FILM FORMATION APPARATUS

BACKGROUND OF THE INVENTION

1. Field of the Invention

An aspect of the present invention relates to at least one of a film formation method and a film formation apparatus.

2. Description of the Related Art

In recent years, a range of materials used for semiconductor devices is transitioning from an inorganic material to an organic material and an organic-inorganic hybrid material. In order to optimize the characteristic of or the manufacturing process for a semiconductor device, a high level of design of a material is being conducted by utilizing a difference between material characteristics of an organic material and an inorganic material.

For one of such organic materials, it is possible to provide a polyimide. A polyimide is excellent as an insulating property thereof, and hence, it is possible to be used for an insulting film in a semiconductor device.

For one example of a method for film-forming a polyimide film, a film formation method based on vapor deposition polymerization has been known that uses pyromellitic dianhydride (PMDA) and 4,4'-diaminodiphenyl ether that contains 4,4'-oxydianiline (ODA), as raw material monomers.

For example, a method for film-forming a polyimide film is disclosed in Japanese Patent No. 4283910, wherein PMDA and ODA monomers are vaporized by a vaporizer and supplied into a film formation unit to cause vapor deposition polarization on a substrate.

In order to obtain a good polyimide film by vapor deposition polymerization, it is necessary to supply certain amounts of vaporized PMDA and ODA into a film formation apparatus intermittently.

On the other hand, a trace amount of a metal component is usually mixed into PMDA as is a raw material at a time of manufacturing. This metal component influences an insulating property of an obtained polyimide film, and hence, is removed by material purification that uses acetic acid and/or acetic anhydride. However, a problem caused by an acetic acid component remaining in PMDA after this material purification is that it is difficult to supply a constant amount of PMDA into a film formation unit intermittently and stably.

Such an adverse effect caused by an impurity component at a time of supplying a raw material gas is not limited to that at a time of film formation of a polyimide film but is also a problem at a time when another organic film or an organic/inorganic composite film is film-formed.

SUMMARY OF THE INVENTION

According to one aspect of the present invention, there is provided a film formation method, including vaporizing a plurality of raw material monomers in respective corresponding vaporizers, supplying the plurality of raw material monomers into a film formation apparatus, causing vapor deposition polymerization of the plurality of raw material monomers in the film formation apparatus to form an organic film on a substrate, and removing an impurity contained in at least one raw material monomer among the plurality of raw material monomers before the vapor deposition polymerization.

According to another aspect of the present invention, there is provided a film formation apparatus, including a mounting part configured to mount a silicon wafer thereon, a first vaporizer configured to mounting an acid dianhydride containing at least one of acetic acid and acetic anhydride thereon, vaporize the acid dianhydride and supply the acid dianhydride to the mounting part, a second vaporizer configured to mount a diamine thereon, vaporize the diamine, and supply the diamine to the mounting part, an inert gas supply part configured to supply an inert gas to the first vaporizer, an exhaust gas part configured to exhaust a gas of the at least one of acetic acid and acetic anhydride contained in the acid dianhydride from an inside of the first vaporizer, and a control part configured to control operations of the first vaporizer, the second vaporizer, the inert gas supply part, and the exhaust gas part to form a polyimide film on the silicon wafer through vapor deposition polymerization of the acid dianhydride and the diamine.

BRIEF DESCRIPTION OF THE DRAWINGS

FIG. 8A, FIG. 8B, FIG. 8C, FIG. 8D, FIG. 8E, FIG. 8F, FIG. 8G, and FIG. 8H are one example of photographs of respective trays after film formation of a polyimide film in the present embodiment.

FIG. 9A, FIG. 9B, FIG. 9C, FIG. 9D, FIG. 9E, FIG. 9F, FIG. 9G, and FIG. 9H are one example of photographs of respective trays after film formation of a polyimide film in a comparative embodiment.

DETAILED DESCRIPTION OF THE PREFERRED EMBODIMENTS

A film formation apparatus and a film formation method according to an embodiment of the present invention will be described below, with reference to the accompanying drawings. Here, although an embodiment for vaporizing, and supplying into a film formation unit, pyromellitic dianhydride (Pyromellitic Dianhydride; PMDA) and 4,4'-oxydianiline (4,4'-Oxydianiline; ODA) so that a polyimide film is film-formed on a substrate such as a wafer for a semiconductor (that will be referred to as a "wafer", below) will be described in the present specification, the present invention is not limited at this matter.

For example, it is also possible to be applied in a case where another insulating film, such as another polyimide due to reaction between another acid dianhydride and another diamine, a polyurea film due to reaction between a diisocyanate and a diamine, a polyurethane film due to reaction between an diisocyanate and a diol, or a polyazomethine film due to reaction between a dialdehyde and a diamine, is film-formed.

[Film Formation Apparatus]

Figure 1:
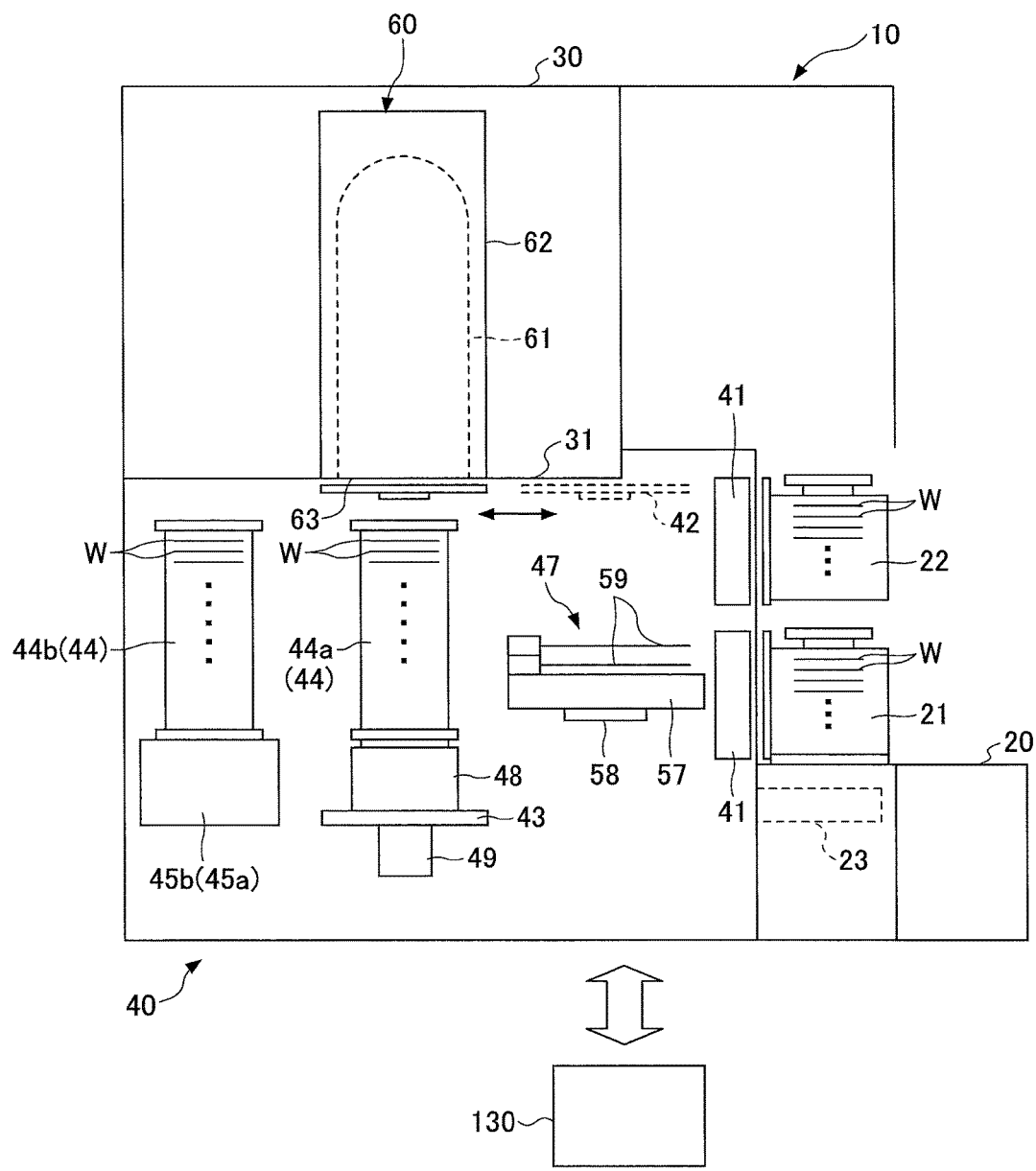
FIG. 1 is a schematic diagram of one example of a film formation apparatus according to the present embodiment.
Figure 2:
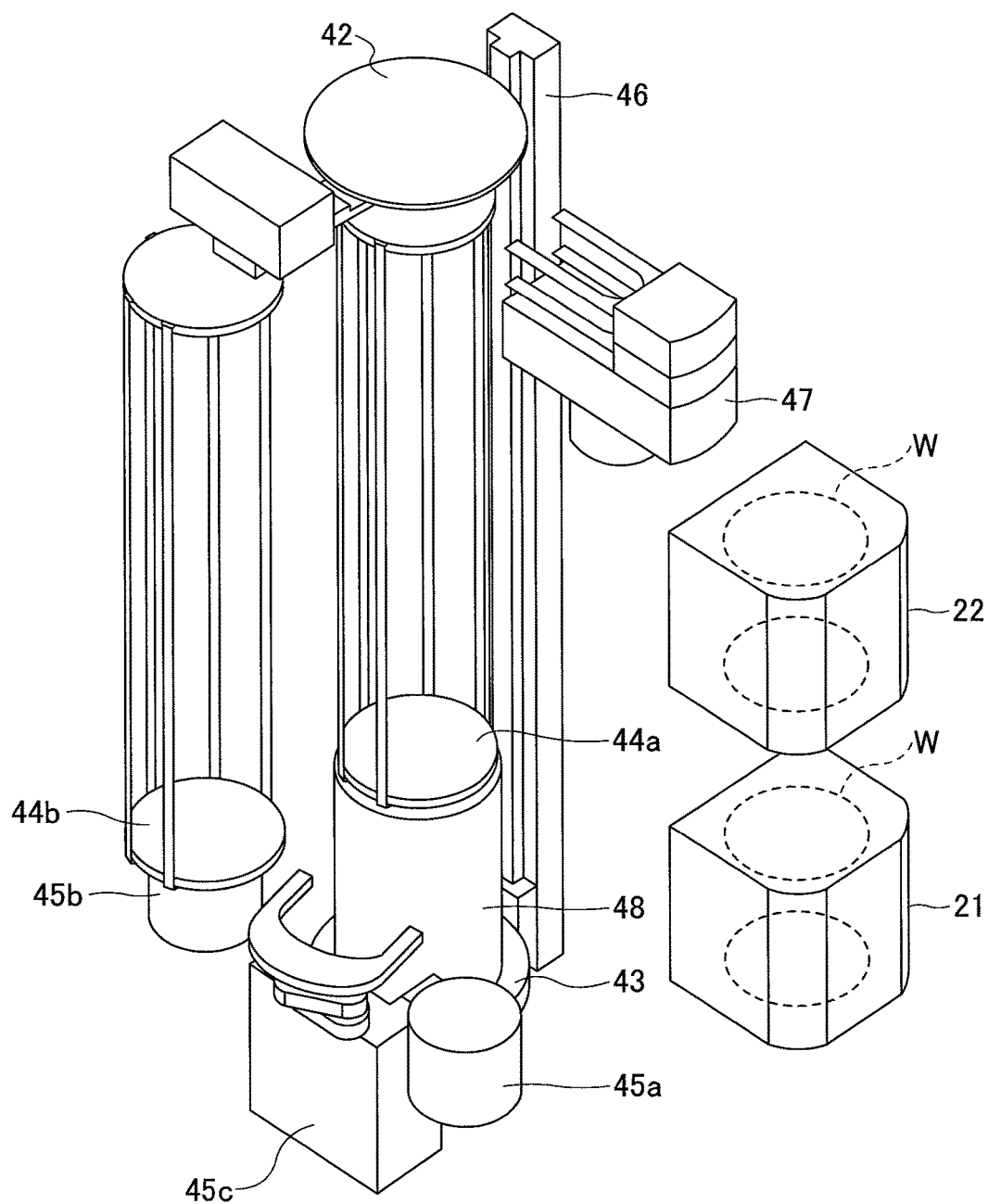
FIG. 2 is a schematic diagram for illustrating a state of a loading area of the film formation apparatus in FIG. 1.
Figure 3:
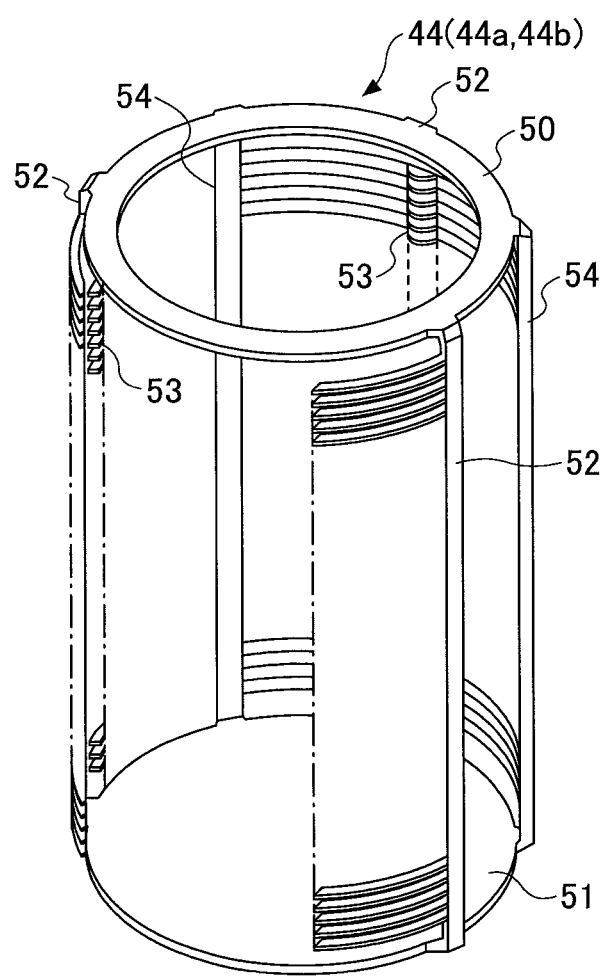
FIG. 3 is a schematic diagram of one example of a boat according to the present embodiment.

FIG. 1 illustrates a schematic diagram of one example of a film formation apparatus according to the present embodiment. Furthermore, FIG. 2 illustrates a schematic diagram for illustrating a state of a loading area of the film formation apparatus in FIG. 1. Moreover, FIG. 3 illustrates a schematic diagram of one example of a boat according to the present embodiment.

In FIG. 1, a film formation apparatus 10 according to the present embodiment has a mounting table (load port) 20, a housing 30, and a control part 130.

The mounting table 20 is provided on a front part of the housing 30. The housing 30 has a loading area (working area) 40 and a film formation unit 60. For one example, the loading area 40 is provided under the housing 30 and the film formation unit 60 is provided above the loading area 40 in the housing 30.

Furthermore, a base plate 31 is provided between the loading area 40 and the film formation unit 60. The base plate 31 is a base plate for placing a reaction tube 61 of the film formation unit 60 and is made of, for example, stainless steel. A not-illustrated opening for inserting the reaction tube 61 from a lower side to an upper side is formed on the base plate 31.

On the mounting table 20, a wafer W is carried into or carried out of the housing 30. Storage containers 21 and 22 are mounted on the mounting table 20. The storage containers 21 and 22 are closed-type storage containers provided with a non-illustrated cap on a front face thereof and being capable of containing a plurality of wafers W at a predetermined interval (FOUP), and for example, are capable of containing approximately 50 wafers W.

Under the mounting table 20, an alignment device (aligner) 23 may be provided to align, in one direction, notching portions (for example, notches) provided around wafers W transferred by a transfer mechanism 47 described below.

In the loading area 40, a wafer W transfers between the storage containers 21 and 22 and a boat 44 described below, and further, the boat 44 is carried into the film formation unit 60 or the boat 44 is carried out of the film formation unit 60. For example, a door mechanism 41, a shutter mechanism 42, a cap body 43, a boat 44, bases 45a and 45b, an elevating mechanism 46 (see FIG. 2), and a transfer mechanism are provided in the loading area 40.

The door mechanism 41 removes caps for the storage containers 21 and 22 so that the inside of the storage containers 21 and 22 is communicated with and opened to the inside of the loading area 40.

The shutter mechanism 42 is provided, for example, above the loading area 40. The shutter mechanism 42 is configured to cover an aperture 63 of the film formation unit 60 to control or prevent releasing of heat from the aperture 63 to the loading area 40 when the cap body 43 is opened.

The cap body 43 has a heat-insulating cylinder 48 and a rotation mechanism 49. The heat-insulating cylinder 48 is provided on the cap body 43. The heat-insulating cylinder 48 is provided to prevent the boat 44 from being cooled through heat transfer at a side of the cap body 43 and heat-insulating the boat 44. The rotation mechanism 49 is installed on a bottom portion of the cap body 43. The rotation mechanism 49 is a mechanism for rotating the boat 44. A rotating shaft of the rotation mechanism 49 is provided to penetrate through the cap body 43 in an airtight manner and rotate a not-illustrated rotating table arranged on the cap body 43.

As illustrated in FIG. 2, the elevating mechanism 46 is driven to move up and down the cap body 43 when the boat 44 is carried into the film formation unit 60 or carried out of the loading area 40. The cap body 43 is configured to contact the aperture 63 (see FIG. 1) and seal the inside of the film formation unit 60 after the cap body 43 elevated by the elevating mechanism 46 is carried into the film formation unit 60. At this time, the boat 44 placed on the cap body 43 holds a wafer W rotatably on a horizontal face in the film formation unit 60.

The film formation apparatus 10 may have a plurality of boats 44. In the following description(s), an example that has two boats such as boats 44a and 44b will be described as one example.

The boats 44a and 44b are provided in the loading area 40. Furthermore, the bases 45a and 45b and a boat carriage mechanism 45c are provided in the loading area 40. The bases 45a and 45b are mounting tables with the boats 44a and 44b being transferred from the cap body 43 thereto, respectively. The boat carriage mechanism 45c is a mechanism for moving the boats 44a and 44b from the cap body 43 to the bases 45a and 45b.

The boats 44a and 44b are made of, for example, quartz, and configured to be capable of holding wafers W, for example, with a diameter of 300 mm horizontally at a predetermined interval (pitch width) in a vertical direction. The boats 44a and 44b have, for example, three supporting posts 52, for example, between a top plate 50 and a bottom plate 51, as illustrated in FIG. 3. The supporting post 52 is provided with a stub 53 for holding a wafer W. The boats 44a and 44b may be provided with a holding post 54 for assisting the supporting posts 52.

As illustrated in FIG. 2, the transfer mechanism 47 is a mechanism for transferring a wafer W between the storage containers 21 and 22 and the boats 44a and 44b. The transfer mechanism 47 has a base 57, an elevating arm 58, and a plurality of forks (transfer plates) 59. The base 57 is provided to be capable of moving up and down and pivoting. The elevating arm 58 is provided to be capable of moving up and down (that is, capable of moving in a vertical direction) by a ball screw or the like and the base 57 is provided to the elevating arm 58 so as to be capable of pivoting horizontally.

Next, a specific configuration of a film formation unit will be described with reference to FIG. 4.

Figure 4:
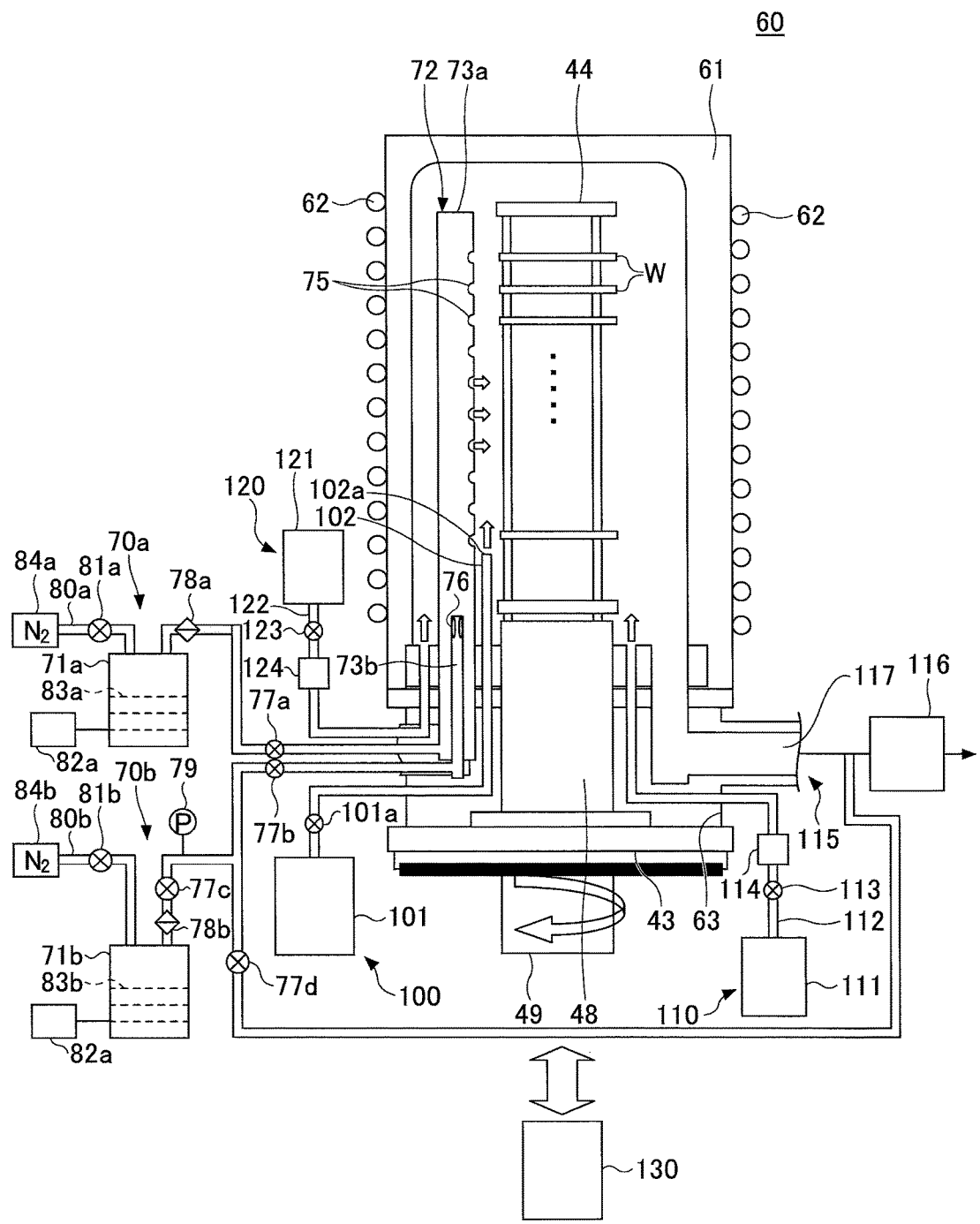
FIG. 4 is a schematic configuration diagram of one example of a film formation unit according to the present embodiment.

FIG. 4 illustrates a schematic configuration diagram of one example of a film formation unit 60 according to the present embodiment.

It is possible for the film formation unit 60 to be a vertical-type furnace for containing a plurality of wafers W and applying thereto a predetermined treatment, for example, a CVD treatment, or the like. The film formation unit 60 has a reaction tube 61, a heater 62, a supply mechanism 70, an adhesion accelerator supply mechanism 100, a purge gas supply mechanism 110, an exhaust gas mechanism 115, and a cleaning gas supply mechanism 120.

The reaction tube 61 is made of, for example, quartz, and an aperture 63 is formed on a bottom thereof. The heater (heating device) 62 is provided to cover a periphery of the reaction tube 61 and is capable of controlling heating of the inside of the reaction tube 61 to a predetermined temperature, for example, from 50 to 1200° C.

The supply mechanism 70 includes a vaporizer 71, and an injector 72 provided in the film formation unit 60, and supplies a gaseous raw material from the vaporizer 71 through the injector 72 into the film formation unit 60. The injector 72 includes a supply tube 73a. The vaporizer 71 is connected to the supply tube 73a of the injector 72.

A supply port 75 that opens to the inside of the film formation unit 60 is formed on the supply tube 73a. The supply tube 73a may be provided to extend in a vertical direction. Then, a plurality of supply ports 75 may be formed on the supply tube 73a. Here, a shape of the supply port 75 may be various kinds of shapes such as circular shapes, elliptical shapes, or rectangular shapes.

It is preferable for the injector 72 to further include the inside supply tube 73b. The inside supply tube 73b may be contained in a part of the supply tube 73a at an upstream side of a gas supply with respect to a part with the supply port 75 being formed thereon. Then, an aperture 76 for supplying a raw material gas to an internal space of the supply tube 73a is provided near an edge of the inside supply tube 73b at a downstream side thereof. A shape of the aperture 76 may be various kinds of shapes such as circular shapes, elliptical shapes, or rectangular shapes. The inside supply tube 73b having such a structure is included so that it is possible to mix a PMDA gas and an ODA gas fully and preliminarily before being supplied from the supply port 75 into the film formation unit 60. Here, although an embodiment for supplying a PMDA gas from the inside supply tube 73b is illustrated in the embodiment illustrated in FIG. 4, a limitation is not made thereto, and an ODA gas may be supplied from the inside supply tube 73b.

In the present embodiment, each of supply mechanisms 70a and 70b has an ODA vaporizer 71a and a PMDA vaporizer 71b so that solid ODA and PMDA raw materials are vaporized, and it is possible to supply a gaseous raw material into the reactor 60.

The ODA vaporizer 71a is connected to the supply tube 73a through a valve 77a. Furthermore, it is preferable to provide a part connecting the ODA vaporizer 71a and the supply tube 73a with a gasket filter 78a described below. Moreover, the ODA vaporizer 71a is controlled by a temperature control part 82a so that an internal temperature is a predetermined temperature.

Furthermore, the PMDA vaporizer 71b is connected to the supply tube 73b through valves 77b and 77c in order. In this case, it is preferable to provide a part connecting the PMDA vaporizer 71b and the supply tube 73b with a gasket filter 78b described below. Furthermore, the PMDA vaporizer 71b is controlled by a temperature control part 82b so that an internal temperature is a predetermined temperature.

A pressure gauge 79 is arranged between the valve 77b and the valve 77c. Furthermore, a pipe connecting the valve 77b and the valve 77c is connected to an exhaust gas tube 117 through a valve 77d. Thereby, it is possible to volatilize and remove an impurity(ies) such as an acetic acid and/or acetic anhydride component(s) in a PMDA raw material contained in the vaporizer 71b by utilizing an exhaust gas device 116. Furthermore, it is possible for the pressure gauge 79 to measure a pressure of the inside of the vaporizer 71b. For a specific example of a method for removing an impurity in a PMDA raw material by utilizing the exhaust gas device 116, when a valve 81b is first opened to provide the PMDA vaporizer 71b with a carrier gas for purging, the valve 77b is closed and the valves 77c and 77d are opened to reduce a pressure of the inside of the vaporizer 71b. Then, a temperature of the inside of the PMDA vaporizer 71b is controlled to be a predetermined temperature by the temperature control part 82b and is held for a predetermined period of time, so that it is possible to remove an acetic acid and/or acetic anhydride component(s) in a PMDA raw material to be at 400 ppm or less.

Here, although a configuration for exhausting a gas in the vaporizer 71b by utilizing the exhaust gas device 116 has been described in the present embodiment, for example, a configuration for exhausting a gas in the vaporizer 71b by arranging a not-illustrated vacuum generator between the valve 77b and the valve 77c may be provided.

The gasket filters 78a and 78b have functions for protecting sheet faces of the valves 77a and 77b that are present at a downstream side with respect to the vaporizers 71a and 71b. In the present embodiment, for example, powdery ODA and PMDA are used and these are vaporized so that raw material gasses are introduced into the film formation unit 60. At a time of sublimation of a powdery raw material, a flow of powder to a secondary side is readily caused. Furthermore, leakage due to introducing of a powder is readily caused at the valves 77a and 77b that are present at a downstream side of a supply of a raw material gas. Hence, it is preferable to arrange the gasket filters 78a and 78b to trap a raw material powder.

A carrier gas is supplied from a carrier gas supply part 84a through a supply tube 80a having a valve 81a to the ODA vaporizer 71a. A carrier gas is supplied from a carrier gas supply part 84b through a supply tube 80b having a valve 81b to the PMDA vaporizer 71b. For a carrier gas, it is possible to provide, for example, an inert gas such as a nitrogen ($N_2$) gas or an argon (Ar) gas, or the like.

A condition for removing an acetic acid and/or acetic anhydride component(s) depends on a condition such as a volume of the vaporizer 71b or an amount of a PMDA raw material and accordingly is not limited, and it is possible to provide, for example, a flow rate of a carrier gas for purging: 200 cc/min, a pressure of the inside of the vaporizer 71b: 100 torr ($1.33 \times 10^4$ Pa), and a temperature of the inside of the vaporizer 71b: 120° C.

A flow rate of a carrier gas at a time of removal of an impurity is not limited and it is possible to provide, for example, $8.33 \times 10^{-7}$ m$^3$/s (50 sccm)–$8.33 \times 10^{-6}$ m$^3$/s (500 sccm). In general, it is possible to remove an impurity more efficiently by increasing a flow rate of a carrier gas. However, a raw material may be dispersed by a carrier gas at a time of removal of an impurity as a flow rate of a carrier gas is increased, and hence, it is preferable for a person skilled in the art to set a flow rate of a carrier gas appropriately depending on the kind(s) of a raw material(s), a desired period of time for removal of an impurity, or the like.

Furthermore, a pressure (carrier gas pressure) of the inside of the vaporizer 71b at a time of removal of an impurity is not limited, and it is possible to provide, for example, $1.33 \times 10^4$ Pa (100 Torr)-$2.66 \times 10^4$ Pa (200 Torr). In general, it is possible to remove an impurity more efficiently by decreasing a carrier gas pressure.

Moreover, a temperature of the inside of the vaporizer 71b at a time of removal of an impurity is not limited, and it is possible to provide, for example, 120° C.-180° C. In general, it is possible to remove an impurity more efficiently by elevating a temperature of the inside of the vaporizer 71b, but a pipe at a downstream side of a PMDA raw material may be clogged by increasing a vapor pressure of a PMDA raw material. Hence, it is preferable for a temperature of the inside of the vaporizer 71b to be a temperature for providing sufficiently high vapor pressures of water and an acetic acid component and a sufficiently low vapor pressure of PMDA.

Here, although an embodiment having a configuration in such a manner that it is possible for only the supply mechanism 70b for supplying a PMDA raw material to volatilize and remove an impurity has been described in the present embodiment, the supply mechanism 70a for supplying an ODA raw material may also have a configuration in such a manner that it is possible to volatilize and remove an impurity similarly.

Furthermore, although a configuration for removing an impurity in a PMDA raw material in the vaporizer 71b for vaporizing a PMDA raw material has been described in the present embodiment, the present invention is not limited to it. That is, a configuration may be provided for preliminarily and separately removing an impurity in a PMDA raw material by the above-mentioned method, filling the vaporizer 71b with the PMDA raw material with an impurity having been removed therefrom, and vaporizing it to supply the PMDA raw material to the film formation unit 60.

On the other hand, a PMDA raw material after an acetic acid and/or acetic anhydride component(s) is/are removed is vaporized by opening all the valves 77b, 77c, and 81b and setting the inside of the vaporizer 71b at a predetermined temperature, and is supplied to the film formation unit 60. A supply condition is not particularly limited and it is possible to provide, for example, a flow rate of a carrier gas for purging: 50 cc/min and a temperature of the inside of the vaporizer 71b: 240° C. or greater. Here, a vapor pressure of PMDA is increased by elevating a temperature of the inside of the vaporizer 71b, and hence, a probability of a solid PMDA being solidified on and attaching to an inner wall face of the PMDA vaporizer 71b is reduced.

Furthermore, an ODA raw material is also vaporized by a similar method and supplied into the film formation unit 60.

It is preferable to provide, in the ODA vaporizer 71a and the PMDA vaporizer 71b, trays 83a and 83b to contain respective raw materials, and are made of, for example, a stainless steel, and arranged at a predetermined interval in a vertical direction of the vaporizers. It is possible to heat a PMDA raw material in a dispersed state by arranging trays and containing the respective raw materials therein. If PMDA is heated for a long period of time and modified by heat, a modified PMDA as a contaminant may be mixed into a vaporized PMDA as well as a vaporized PMDA may not stably be supplied. In this case, an adverse effect is caused on a film quality of a polyimide film that is film-formed on a wafer W. However, a PMDA raw material remains on a certain location for a long period of time and is heated for a long period of time in the present embodiment, and thereby, there is no possibility of modification of a PMDA raw material. Furthermore, controlling of an amount of vaporized raw material to be supplied into the film formation unit 60 is facilitated.

By the supply mechanism 70 as described above, an ODA gas flows through the supply tube 73a and a PMDA gas flows through the inside supply tube 73b. Then, a PMDA gas flowing through the inside supply tube 73b is combined into the supply tube 73a through the aperture 76 and the PMDA gas and an ODA gas in a mixed state are supplied into the film formation unit 60 through the supply port 75.

It is preferable for the film formation unit 60 to have the adhesion accelerator supply mechanism 100. The adhesion accelerator supply mechanism 100 includes a vaporizer 101, and a supply tube 102 provided in the film formation unit 60. The vaporizer 101 is connected to the supply tube 102 through a valve 101a. The adhesion accelerator supply mechanism 100 is configured to supply an adhesion accelerator gas provided by vaporizing an adhesion accelerator into the film formation unit 60 and treat a surface of a wafer W with the adhesion accelerator gas. The adhesion accelerator is not particularly limited, and it is possible to provide, for example, a silane coupling agent or the like.

Furthermore, it is preferable for the film formation unit 60 to have the purge gas supply mechanism 110. The purge gas supply mechanism 110 includes a purge gas supply part 111 and a purge gas supply tube 112. The purge gas supply part 111 is connected to the film formation unit 60 through the purge gas supply tube 112 and supplies a purge gas into the film formation unit 60. Furthermore, a valve 113 for communicating or blocking the purge gas supply part 111 with or from the interior of the film formation unit 60 and a mass flow controller (MFC) 94 for controlling a flow rate of a purge gas are provided in a middle of the purge gas supply tube 112. For a purge gas, it is possible to use, for example, an inert gas such as an $N_2$ gas.

The film formation unit 60 has the exhaust gas mechanism 115. The exhaust gas mechanism 115 includes an exhaust gas device 116 and an exhaust gas pipe 117. The exhaust gas mechanism 115 is to exhaust a gas from the inside of the film formation unit 60 through the exhaust gas pipe 117.

It is preferable for the film formation unit 60 to have the cleaning gas supply mechanism 120. The cleaning gas supply mechanism 120 includes a cleaning gas supply part 121 and a cleaning gas supply tube 122. The cleaning gas supply part 121 is connected to the film formation unit 60 through the cleaning gas supply tube 122 and supplies a cleaning gas into the film formation unit 60. Furthermore, a valve 123 for communicating or blocking the cleaning gas supply part 121 with or from the interior of the film formation unit 60, and an MFC 124 for controlling a flow rate of a cleaning gas are provided in a middle of the cleaning gas supply tube 122. A cleaning gas is not limited and it is possible to use, for example, an oxygen ($O_2$) gas.

The control part 130 has, for example, an arithmetic processing unit, a storage unit, and a display unit that are not illustrated. The arithmetic processing unit is, for example, a computer having a CPU (Central Processing Unit). The storage unit is composed of a computer-readable recording medium composed of, for example, a hard disk, that records a program for causing the arithmetic processing unit to execute each kind of process. The display part is composed of, for example, a screen of a computer. The arithmetic processing unit reads a program recorded in the storage part, sends a control signal to each part that composes the boat 44, the heater 62, the supply mechanism 70, the adhesion accelerator supply mechanism 100, the purge gas supply mechanism 110, the exhaust gas mechanism 115, and the cleaning gas supply mechanism 120, according to that program, and executes a film formation treatment as described below.

As described above, a film formation apparatus for film-forming a polyimide film according to the present embodiment has a configuration for removing an impurity in a PMDA raw material. It is possible for an impurity removal treatment to remove an impurity with a vapor pressure higher than that of a PMDA raw material preferentially, by, for example, purging the inside of a vaporizer with an inert gas and subsequently heating the inside of a system under a reduced pressure. Thereby, an impurity in a PMDA raw material is removed and it is possible to supply a certain amount of a vaporized PMDA into a film formation apparatus intermittently.

[Film Formation Method]

Figure 5:
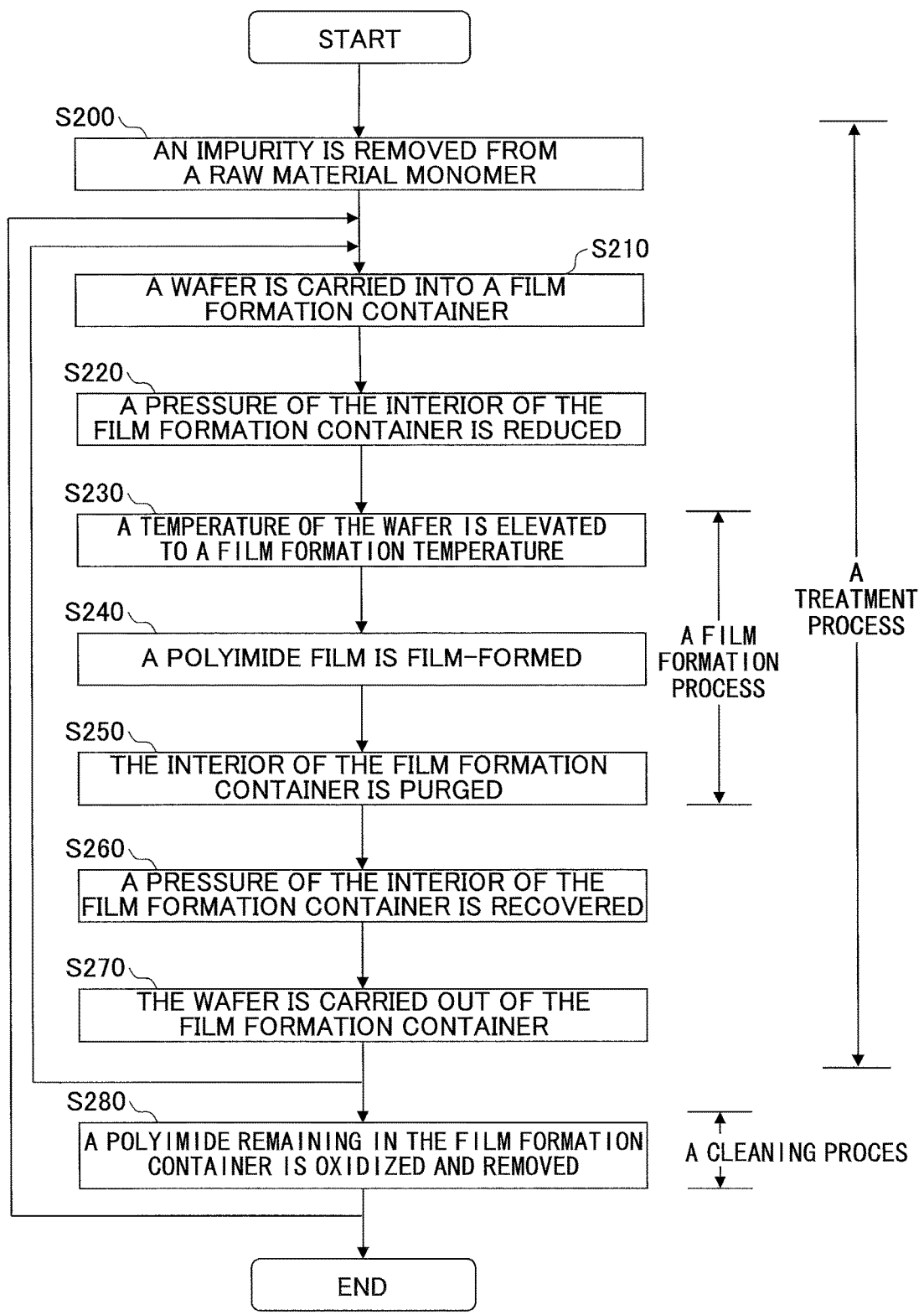
FIG. 5 is a flow diagram for illustrating a procedure for each process in a film formation method according to the present embodiment.

Next, a film formation method will be described that uses the film formation apparatus according to the present embodiment. FIG. 5 illustrates a flow diagram for illustrating a procedure of each process in a film formation method according to the present embodiment.

First, at step S200, an impurity is removed from a solid PMDA raw material held in the PMDA vaporizer 71*b*. For an impurity, it is possible to provide acetic acid and/or acetic anhydride or the like, as described above.

For a method of removal of an impurity, it is possible to provide a method for volatilizing and removing an impurity, as described above. Specifically, a pressure of the inside of the PMDA vaporizer 71*b* is reduced by opening 77*c* and closing the valve 77*b* on a condition that a valve 81*b* is opened to purge the PMDA vaporizer 71*b* with a carrier gas. Then, a temperature of the inside of the PMDA vaporizer 71*b* is set at a predetermined temperature by the temperature control part 82*b*, so that it is possible to remove an acetic acid and/or acetic anhydride component(s) in a PMDA raw material. Here, it is preferable for a concentration of an acetic acid and/or acetic anhydride component(s) in a PMDA raw material to be 400 ppm or less by volatilization and removal thereof.

Here, although a configuration for conducing removal of an impurity in the PMDA vaporizer 71*b* at step S200 has been described in the present embodiment, the present invention is not limited thereto. That is, an impurity in a PMDA raw material may be preliminarily and separately removed by a method described above, the inside of the vaporizer 71*b* may be filled with the PMDA raw material with an impurity having been removed therefrom, and going to next step S210 may be conducted.

Furthermore, as long as step S200 is conducted before step S240 described below, an order or sequencing of step S210 and step S220 described below is not limited.

Then, at step S210, a wafer W is carried into the film formation unit 60. In an example of the film formation apparatus 10 illustrated in FIG. 1, for example, it is possible for a wafer W to be transferred from the storage container 21 to the boat 44 by the transfer mechanism 47 in the loading area 40 and to be transferred onto the cap body 43 by the boat carriage mechanism 45*c*. Then, the cap body 43 with the boat 44*a* transferred thereon is elevated by the elevating mechanism 46 so that a wafer W is carried into the film formation unit 60.

Then, at step S220, the interior of the film formation unit 60 is reduced. A pressure of the interior of the film formation unit 60 is reduced to a predetermined pressure, for example, 0.3 Torr.

Then, at step S230, a temperature of a wafer W is elevated to a film formation temperature. After the boat 44*a* is carried into the interior of the film formation unit 60, an electric power is supplied to the heater 62 so that a temperature of a wafer W mounted on the boat 44*a* is elevated to a film formation temperature. Here, when a wafer W is heated by the heater 62, an adhesion accelerator gas may be supplied into the film formation unit 60 by the adhesion accelerator supply mechanism 100. Thereby, it is possible to improve an adhesion property of a polyimide film to be film-formed.

Then, at step S240, a polyimide film is film-formed.

A first flow rate F1 of an ODA gas flowing through the supply tube 73*a* and a second flow rate F2 of a PMDA gas flowing through the inside supply tube 73*b* are preliminarily set by the control part 130. Then, an ODA gas and a PMDA gas flow at set flow rates F1 and F2 on a condition that a wafer W is rotated by the rotation mechanism 49, so that the ODA gas and the PMDA gas are supplied into the film formation unit 60 on a condition of being mixed at a predetermined mixing ratio. Then, a polymerization reaction between PMDA and ODA is caused on a surface of a wafer W to film-form a polyimide film. Specifically, it is possible to set the first flow rate F1 at 900 sccm and the second flow rate F2 at 900 sccm.

Herein, a polymerization reaction between PMDA and ODA is in accordance with the following reaction formula (I):

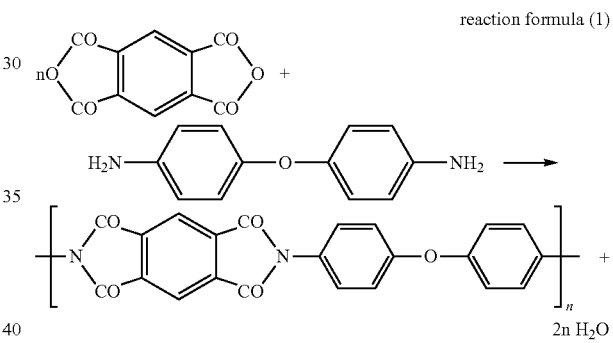

reaction formula (1)

Then, at step S250, supply of an ODA gas from the ODA vaporizer 71*a* and supply of a PMDA gas from the PMDA vaporizer 71*b* are stopped and the interior of the film formation unit 60 is purged with a purge gas. It is possible to stop supply of an ODA gas from the ODA vaporizer 71*a* by closing the valve 77*a*. Furthermore, it is possible to stop supply of a PMDA gas from the PMDA vaporizer 71*b* by closing the valve 77. Then, the purge gas supply mechanism 110 and the exhaust gas mechanism 115 are controlled, so that a raw material gas in the interior of the film formation unit 60 is replaced by a purge gas.

For a method for replacement with a purge gas, for example, a not-illustrated flow rate adjustment valve possessed by the exhaust gas device 116 is adjusted to increase an amount of an exhaust gas, and thereby, a pressure of the interior of the film formation unit 60 is reduced to, for example, 0.3 Torr. Subsequently, an amount of an exhaust gas is reduced, or a purge gas is supplied into the film formation unit 60 through the purge gas supply mechanism 110 by opening the valve 113 until a pressure of the interior of the film formation unit 60 is, for example, 5.0 Torr, on a condition that gas exhausting is stopped. Thereby, it is possible to replace a raw material gas in the film formation unit 60 with a purge gas. Furthermore, after pressure reduction by the exhaust gas mechanism 115 and supply of a purge gas by the purge gas supply mechanism 110 are once conducted, pressure reduction and supply of a purge gas may further be repeated more than once. Thereby, it is possible to replace a raw material gas in the film formation unit 60 with a purge gas more certainly.

In the present embodiment, heat treatment of a polyimide film that is film-formed on a wafer W may be conducted by the heater 62 at a time of the aforementioned purging. The heat treatment is conducted to imidize an un-imidized portion of the film after film formation. Because a polyimide has a high insulating property, it is possible to improve an insulating property of a film-formed polyimide film by increasing a rate of imidization that is a rate of polyimide in the film.

Then, at step S260, a pressure of the interior of the film formation unit 60 is recovered to be an atmospheric pressure. The non-illustrated flow rate adjustment valve of the exhaust gas mechanism 116 is adjusted so that an amount of an exhaust gas exhausting from the film formation unit 60 is reduced in such a manner that a pressure of the interior of the film formation unit 60 is recovered to be from, for example, 0.3 Torr to, for example, an atmospheric pressure.

Then, at step S270, a wafer W is carried out of the film formation unit 60. For an example of the film formation apparatus 10 illustrated in FIG. 1, for example, it is possible for the elevating mechanism 46 to move down, and carry out of the inside of the film formation unit 60 to the loading area 40, the cap body 43 with the boat 44 mounted thereon. Then, a wafer W is transferred from the boat 44*a* mounted on the carried cap body 43 to the storage container 21 by the transfer mechanism 47, and thereby, it is possible to carry the wafer W out of the film formation unit 60.

Here, after a film formation treatment is completed, it is preferable to oxidize and remove a polyimide remaining in the film formation unit 60 at step S280. For removal of a remaining polyimide, a cleaning gas that is, for example, oxygen gas is supplied into the film formation unit 60 by the cleaning gas supply mechanism 120. Then, the inside of the film formation unit 60 under an oxygen atmosphere is heated by the heater 62. Herein, the film formation unit 60 is heated at a temperature of 360-540° C. to oxidize and remove a polyimide remaining in the film formation unit 60. Thereby, it is possible to prevent a polyimide remaining in the film formation unit 60 from being carbonized by thermal decomposition.

Here, when a plurality of wafers W are treated continuously, a treatment of S210-S270 including a film formation process of S230-S250, and a cleaning treatment of S280 may be applied to every single wafer W. Alternatively, a treatment of S210-S270 including a film formation process of S230-S250 may be applied to a single wafer W, and after the treatment is completed for a predetermined number thereof, a cleaning treatment of S280 may be applied thereto.

As described above, an impurity removal treatment is preliminarily applied to a PMDA raw material before a film formation treatment in a film formation method for film-forming a polyimide film in the present embodiment. For the impurity removal treatment, for example, after the inside of a vaporizer is purged with an inert gas, the inside of a system is heated under a reduced pressure, so that it is possible to remove an impurity with a vapor pressure higher than that of a PMDA raw material preferentially. Thereby, an impurity in a PMDA raw material is removed, and it is possible to supply a certain amount of a vaporized PMDA into a film formation apparatus intermittently.

(First Embodiment)

An embodiment will be described for confirming a problem in a method for removing an impurity in a PMDA raw material according to a conventional method.

A PMDA raw material with a concentration of acetic acid being 1000 ppm or less and concentrations of aluminum (Al), boron (B), calcium (Ca), cadmium (Cd), cobalt (Co), chromium (Cr), copper (Cu), iron (Fe), potassium (K), lithium (Li), magnesium (Mg), manganese (Mn), sodium (Na), nickel (Ni), lead (Pb), antimony (Sb), titanium (Ti), vanadium (V), and zinc (Zn) being 100 ppb or less was used in all the following embodiments.

Figure 6:
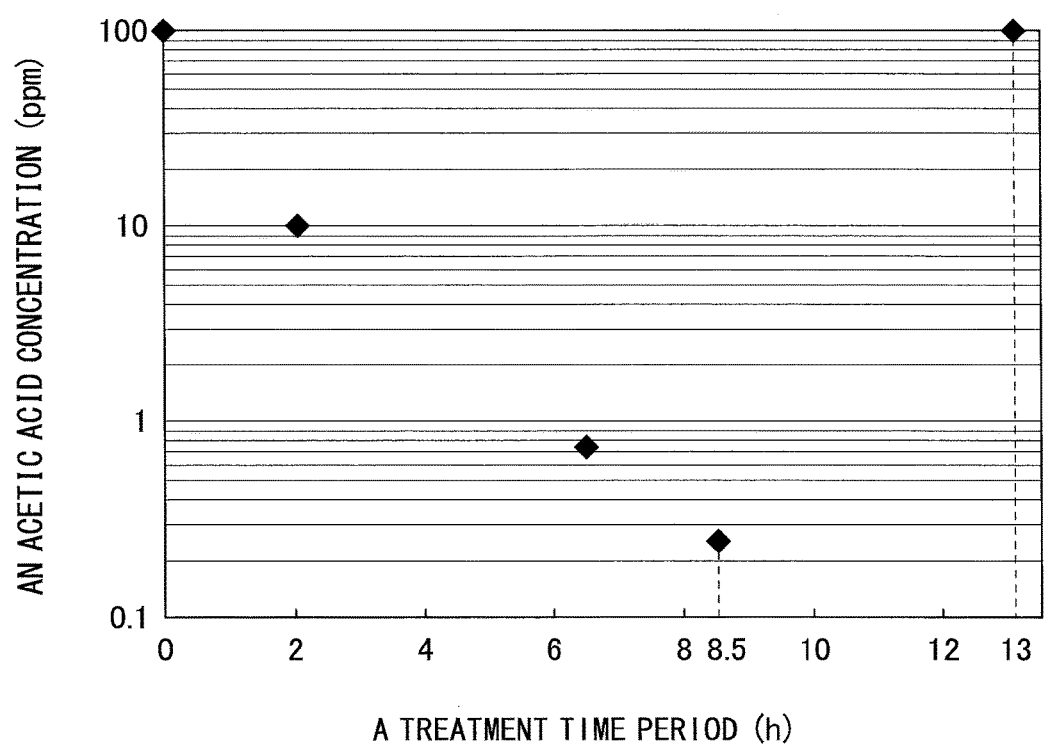
FIG. 6 is a schematic diagram for illustrating a relationship between a PMDA raw material and an acetic acid concentration.

FIG. 6 illustrates a schematic diagram for illustrating a relationship between a PMDA raw material and a concentration of acetic acid. More specifically, FIG. 6 is a schematic diagram of a change in a concentration of an acetic acid in a system (in a gas phase) in a case where an acetic acid and/or acetic anhydride removal treatment was applied to a PMDA raw material for 8.5 hours according to the volatilization removal method as described above (wherein a time of starting of the removal treatment was 0) and subsequently a vacuum state was held for 5 hours. Here, in FIG. 6, a horizontal axis indicates a time and a vertical axis indicates a concentration of acetic acid.

As is clear from FIG. 6, a concentration of oxygen in the system was decreased during an acetic acid and/or acetic anhydride removal treatment. However, an acetic acid and/or acetic anhydride component(s) was/were concentrated in a gas phase by holding an obtained PMDA raw material in a vacuum state in the conventional method even though an acetic acid and/or acetic anhydride removal treatment was conducted. This fact meant that if an amount of a removed acetic acid and/or acetic anhydride was insufficient, an acetic acid and/or acetic anhydride component(s) was concentrated in the gas phase during transportation of a raw material, standby, or the like, even for a PMDA raw material subjected to an acetic acid and/or acetic anhydride removal treatment, and could provide an adverse effect at a time of film formation.

(Second Embodiment)

An embodiment will be described for confirming that it was possible to supply a certain amount of PMDA into a film formation apparatus intermittently by removing an impurity in a PMDA raw material.

Here, the film formation unit 60 described with FIG. 4 was used for a film formation unit in all the following embodiments. Furthermore, 8 trays made of stainless steel that were tray 1-tray 8 were arranged at a predetermined interval in order from a bottom in a vertical direction in the PMDA vaporizer 71*b* and a PMDA raw material was received in each tray. Furthermore, the gasket filter 78 was arranged at a downstream side of the vaporizer 71*b*.

First, a PMDA raw material described above was put into the PMDA vaporizer 71*b* in the film formation unit 60 in FIGS. 4 and 77*c* was opened and the valve 77*b* was closed to reduce a pressure of the inside of the PMDA vaporizer 71*b* on a condition that the valve 81*b* was opened to providing a carrier gas for purging to the PMDA vaporizer 71*b*. Subsequently, a temperature of the inside of the PMDA vaporizer 71*b* was set at a predetermined temperature by the temperature control part 82*b* so that an acetic acid and/or acetic anhydride component(s) in a PMDA raw material was/were volatilized and removed to be 400 ppm or less. Here, conditions for volatilization and removal were a flow rate of a carrier gas for purging: 200 cc/min, a pressure of the inside of the vaporizer 71*b*: 100 Torr ($1.33 \times 10^4$ Pa), and a temperature of the inside of the vaporizer 71*b*: 120° C.

A polyimide film was film-formed on a wafer W by using a PMDA raw material with an acetic acid and/or acetic anhydride component(s) having been volatilized and removed therefrom in the above-mentioned method illustrated in FIG. 5 or the like. Furthermore, for a comparative example, a polyimide film was similarly film-formed on a wafer W by using a PMDA raw material with the volatilization and removal described above having not been conducted thereon.

Figure 7A:
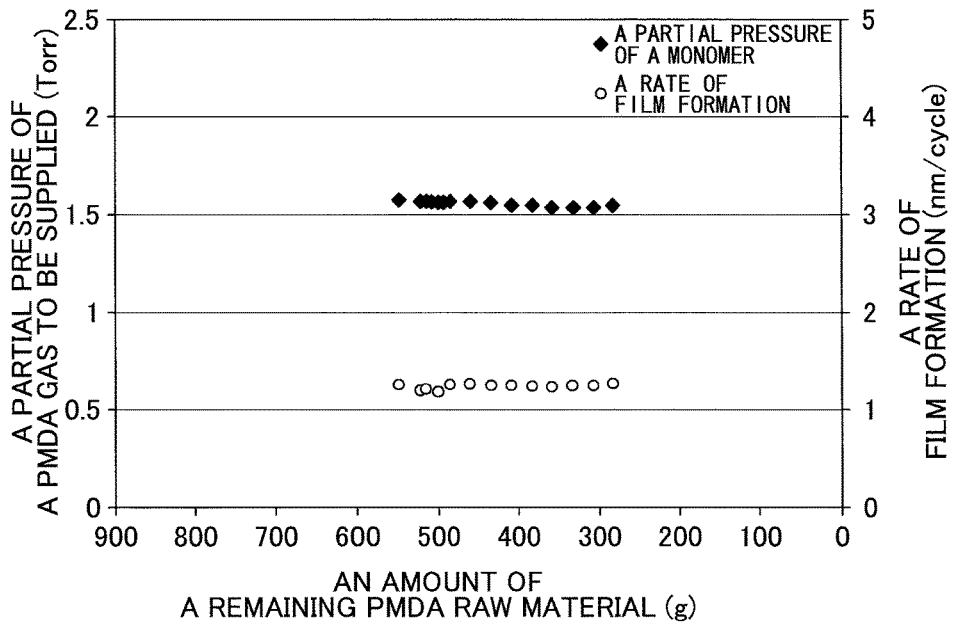
FIG. 7A and FIG. 7B are diagrams illustrating one example of a film formation rate for a polyimide film and a partial pressure of a PMDA gas to be supplied versus an amount of a remaining PMDA raw material.
Figure 7B:
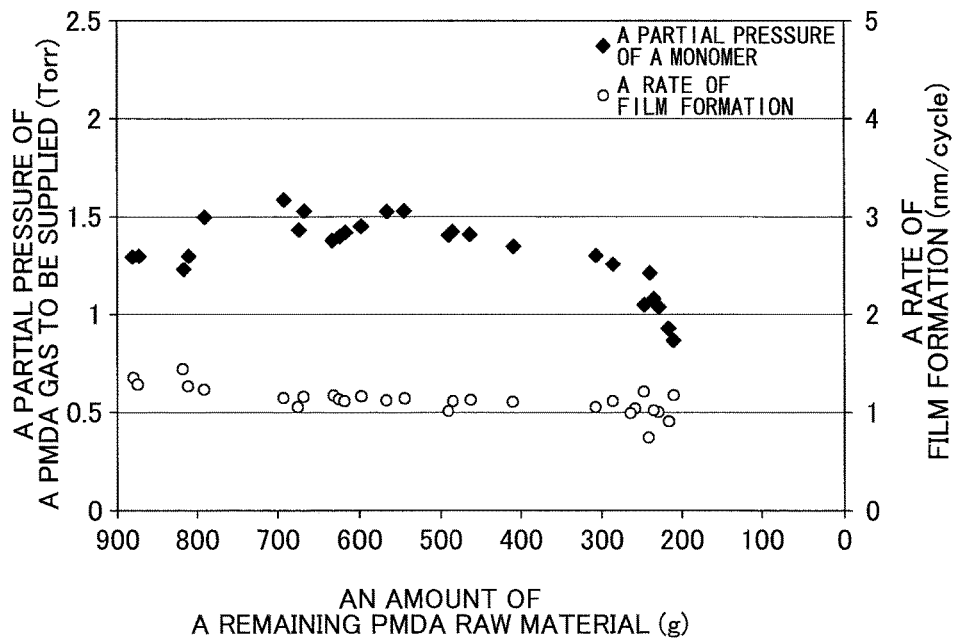

FIG. 7A and FIG. 7B are figures illustrating one example of a film formation rate for a polyimide film and a partial pressure of a PMDA gas to be supplied versus an amount of a remaining PMDA raw material. FIG. 7A is a figure for the present embodiment and FIG. 7B is a figure for a comparative embodiment.

It could be found from FIG. 7A that a film formation rate for a polyimide film and a partial pressure of a PMDA gas to be supplied were generally constant and dispersions thereof were small even when film formation of the polyimide is progressed in a case where a PMDA raw material with an acetic acid and/or acetic anhydride component(s) being volatilized and removed to be 50 ppm or less was used. It could be considered that this was caused by the possibility that an impurity in a PMDA raw material was removed and thereby a certain amount of a volatilized PMDA was supplied into the film formation apparatus intermittently.

On the other hand, from FIG. 7B, a film formation rate for a polyimide film and a partial pressure of a PMDA gas to be supplied were decreased with a progressing film formation of the polyimide film and further dispersions thereof were large in a case where a PMDA raw material with an acetic acid and/or acetic anhydride component(s) having not been volatilized or removed was used. It could be considered that this was caused by the possibility that an acetic acid and/or acetic anhydride component(s) remaining in a PMDA raw material reacted with a trace amount of a metal component(s) remaining in a PMDA raw material or a PMDA raw material was modified by some causes.

FIG. 8A, FIG. 8B, FIG. 8C, FIG. 8D, FIG. 8E, FIG. 8F, FIG. 8G, and FIG. 8H illustrate one example of photographs of respective trays after film formation of a polyimide film in the present embodiment. Furthermore, FIG. 9A, FIG. 9B, FIG. 9C, FIG. 9D, FIG. 9E, FIG. 9F, FIG. 9G, and FIG. 9H illustrate one example of photographs of respective trays after film formation of a polyimide film in the comparative example. Moreover, Table 1 illustrates a residual factor of a PMDA raw material in each tray after film formation in the present embodiment and the comparative embodiment.

TABLE 1

| Tray | Practical Example Residual factor (%) | Comparative Example Residual factor (%) |
|---|---|---|
| 1 (bottom) | 1.0 | 1.0 |
| 2 | 2.3 | 1.2 |
| 3 | 1.5 | 1.5 |
| 4 | 9.6 | 48.6 |
| 5 | 60.4 | 76.3 |
| 6 | 85.0 | 99.6 |
| 7 | 70.0 | 48.3 |
| 8 (top) | 55.3 | 66.0 |

From Table 1, a residual factor of a PMDA raw material was small in the lower trays (trays 1 to 4) among trays in the present embodiment and almost all of a PMDA raw material had been used. On the other hand, a residual factor of a PMDA raw material was comparatively large in the upper trays (trays 5 to 8) and a deposit originating from a PMDA raw material was present.

Furthermore, from FIG. 8A, FIG. 8B, FIG. 8C, FIG. 8D, FIG. 8E, FIG. 8F, FIG. 8G, and FIG. 8H, a deposit present in trays 5 to 8 was mainly a gray and flocculent substance and a black substance was partially found. Furthermore, an unsymmetrical wear of a PMDA raw material was found on tray 8.

On the other hand, from Table 1, a residual factor of a PMDA raw material was small in the lower trays (trays 1 to 3) among trays in the comparative embodiment and almost all of a PMDA raw material had been used. On the other hand, a residual factor of a PMDA raw material in the middle trays (trays 5 and 6) and the upper trays (trays 7 and 8) was larger than that of the trays in the present embodiment and a large amount of a deposit was present.

Furthermore, from FIG. 9A, FIG. 9B, FIG. 9C, FIG. 9D, FIG. 9E, FIG. 9F, FIG. 9G, and FIG. 9H, a deposit remaining on trays 4 to 8 was present in such a manner that a black deposit and a white deposit were mixed. Furthermore, not-illustrated color development caused by growing of an oxide film was found on a portion of a back face (a surface where a PMDA raw material was not arranged thereon) of a tray.

Figure 10:
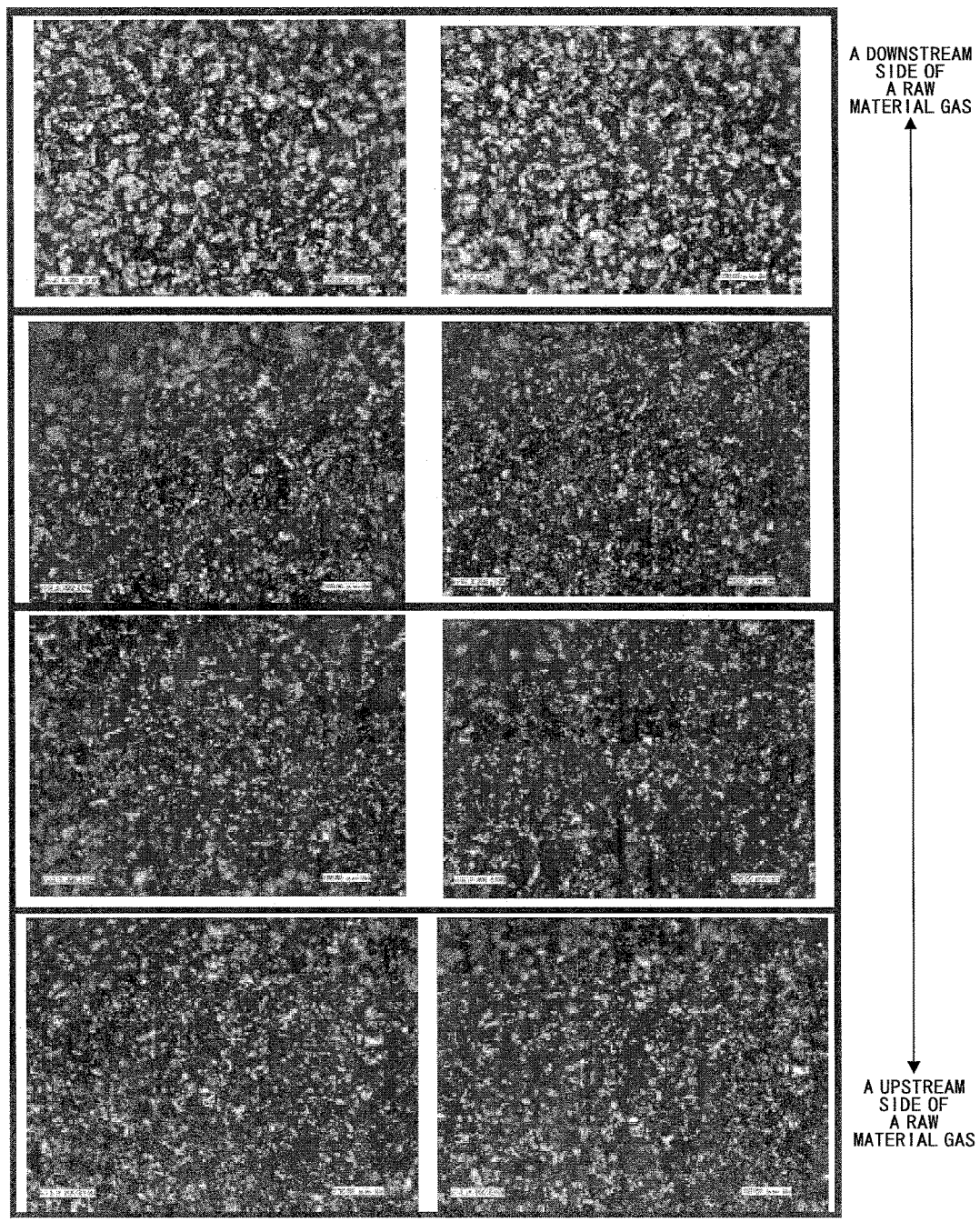
FIG. 10 is one example of microscopic images of a gasket filter after film formation of a polyimide film in the present embodiment.

FIG. 10 illustrates one example of microscopic images of a gasket filter in the present embodiment. Here, the microscopic images in FIG. 10 are typical microscopic images wherein a gasket filter was cut into four generally equal parts from an upstream side to a downstream side of supply of a PMDA raw material and on a filter surface in each area was provided at a magnification factor of 300.

From FIG. 10, a stainless steel short fiber that principally originated from filter material was found and a deposit originating from a PMDA raw material was hardly found, in any area among four areas of a gasket filter after a method of film formation in the present embodiment.

Figure 11:
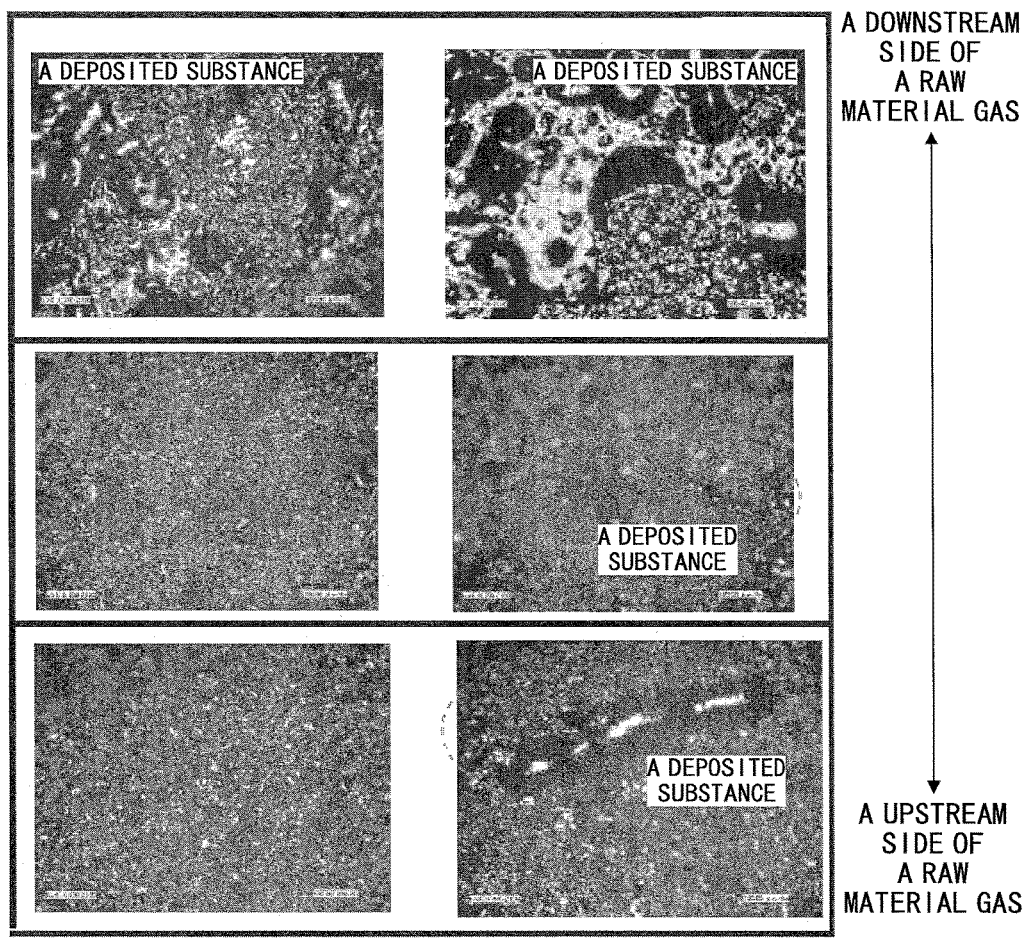
FIG. 11 is one example of microscopic images of a gasket filter after film formation of a polyimide film in the comparative embodiment.

Furthermore, FIG. 11 illustrates one example of microscopic images of a gasket filter in the comparative embodiment. Here, microscopic images in FIG. 11 are typical microscopic images wherein a gasket filter was cut into three generally equal parts from an upstream side to a downstream side of supply of a PMDA raw material and on a filter surface in each area was provided at a magnification factor of 300.

From FIG. 11, a large amount of a deposit originating from PMDA was found in any areas among three areas of a gasket filter after a method of film formation in the present embodiment. It was considered that this was a reaction product provided by reacting an acetic acid and/or acetic anhydride component(s) remaining in a PMDA raw material with a trace amount of a metal component(s) remaining in a PMDA raw material or a modified product provided by modifying a PMDA raw material due to some causes.

As described above, an impurity removal treatment is preliminarily applied to a PMDA raw material before a film formation treatment in a film formation method for film-forming a polyimide film according to the present embodiment, and thereby, an impurity in a PMDA raw material is removed, so that it is possible to supply a certain amount of vaporized PMDA into a film formation apparatus intermittently.

(Third Embodiment)

An embodiment will be described for confirming a relationship between a flow rate of a carrier gas and the efficiency of removal of an acetic acid and/or acetic anhydride component(s) in a film formation method in the present embodiment.

Figure 12:
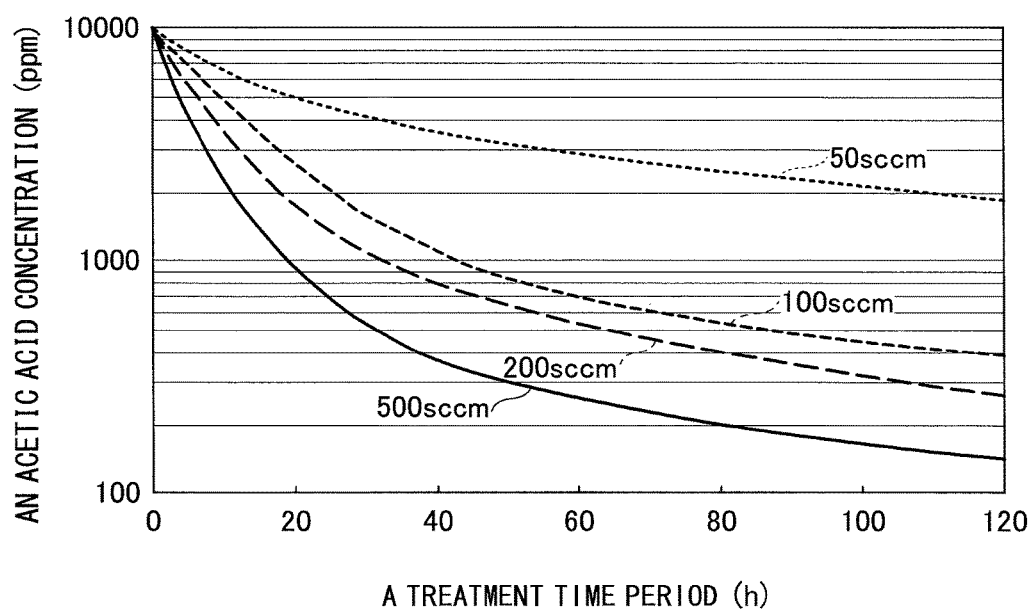
FIG. 12 is a schematic diagram for illustrating a relationship between a flow rate of a purge gas and the efficiency of removal of an acetic acid and/or acetic anhydride component(s) in a film formation method according to the present embodiment.

FIG. 12 illustrates a schematic diagram for illustrating a relationship between a flow rate of a carrier gas and the efficiency of removal of an acetic acid and/or acetic anhydride component(s) in a film formation method according to the present embodiment. In FIG. 12, a horizontal axis indicates a period of time for removal of an acetic acid and/or acid anhydride component(s) and a vertical axis indicates a concentration of acetic acid in a PMDA raw material.

As is clear from FIG. 12, it could be found that it was possible to remove an acetic acid and/or acetic anhydride component(s) more efficiently by increasing a flow rate of a carrier gas in a range of a flow rate of a carrier gas in the present embodiment.

Figure 13A:
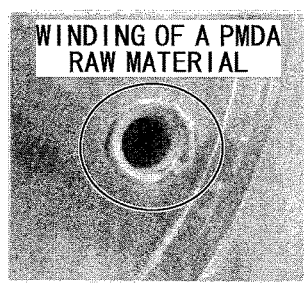
FIG. 13A, FIG. 13B, and FIG. 13C are one example of photographs of a cap part of a PMDA vaporizer after removal of an acetic acid and/or acetic anhydride component(s) in the present embodiment.
Figure 13B:
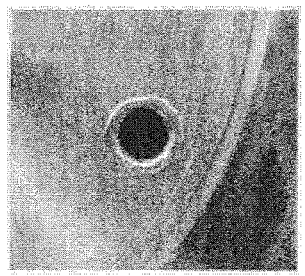
Figure 13C:
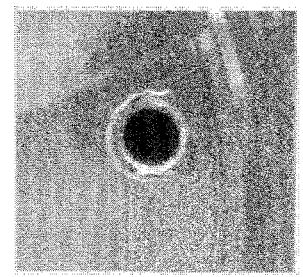

Furthermore, FIG. 13A, FIG. 13B, and FIG. 13C illustrate one example of photographs of a cap part of the PMDA vaporizer 71b after removal of an acetic acid and/or acetic anhydride component(s) in the present embodiment. More specifically, FIG. 13A is a photograph in a case where a flow rate of a carrier gas is 500 sccm, FIG. 13B is a photograph in a case where a flow rate of a carrier gas is 200 sccm, and FIG. 13C is a photograph in a case where a flow rate of a carrier gas is 100 sccm.

As is clear from the comparison between FIG. 13A and FIGS. 13B and 13C, entrainment of a PMDA raw material by a carrier gas was confirmed when a flow rate of the carrier gas is increased to be 500 sccm.

From the result described above, 200 sccm was selected for a flow rate of a carrier gas in the above-mentioned second embodiment from the viewpoint of a balance between the efficiency of removal of an acetic acid and/or acetic anhydride component(s) and suppression of winding of the PMDA raw material.

(Fourth Embodiment)

An embodiment will be described for confirming a relationship between a carrier gas pressure and the efficiency of removal of an acetic acid and/or acetic anhydride component(s) in a film formation method according to the present embodiment.

Figure 14:
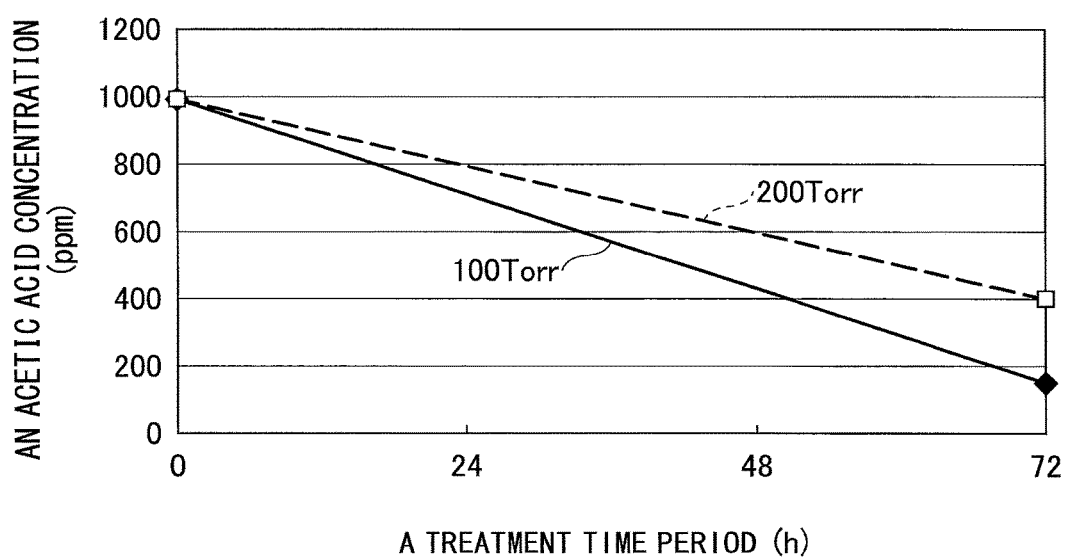
FIG. 14 is a schematic diagram for illustrating a relationship between a carrier gas pressure and the efficiency of removal of an acetic acid and/or acetic anhydride component(s) in a film formation method according to the present embodiment.

FIG. 14 illustrates a schematic diagram for illustrating a relationship between a carrier gas pressure and the efficiency of removal of an acetic acid and/or acetic anhydride component(s) in a film formation method according to the present embodiment. In FIG. 14, a horizontal axis indicates a period of time for removal of an acetic acid and/or acetic anhydride component(s) and a vertical axis indicates a concentration of acetic acid in a PMDA raw material.

As is clear from FIG. 14, it could be found that it was possible to remove an acetic acid and/or acetic anhydride component(s) more efficiently by decreasing a carrier gas pressure in a range of a carrier gas pressure in the present embodiment.

(Fifth Embodiment)

An embodiment will be described for confirming a relationship between a temperature and the efficiency of removal of an acetic acid and/or acetic anhydride component(s) in a film formation method according to the present embodiment.

Table 2 illustrates a summary of values of a concentration of an acetic acid in a PMDA raw material after treatment at a treatment temperature at a time of removal of the acetic acid and/or acetic anhydride component(s).

TABLE 2

| A treatment temperature (° C.) | 120 ° C. | 130 ° C. | 180 ° C. |
|---|---|---|---|
| A concentration of acetic acid in a PMDA raw material (ppm) | 330 | 220 | 110 |

As illustrated in Table 2, it could be found that it was possible to remove an acetic acid and/or acetic anhydride component(s) more efficiently by elevating a treatment temperature at a time of removal of the acetic acid and/or acetic anhydride component(s).

Figure 15:
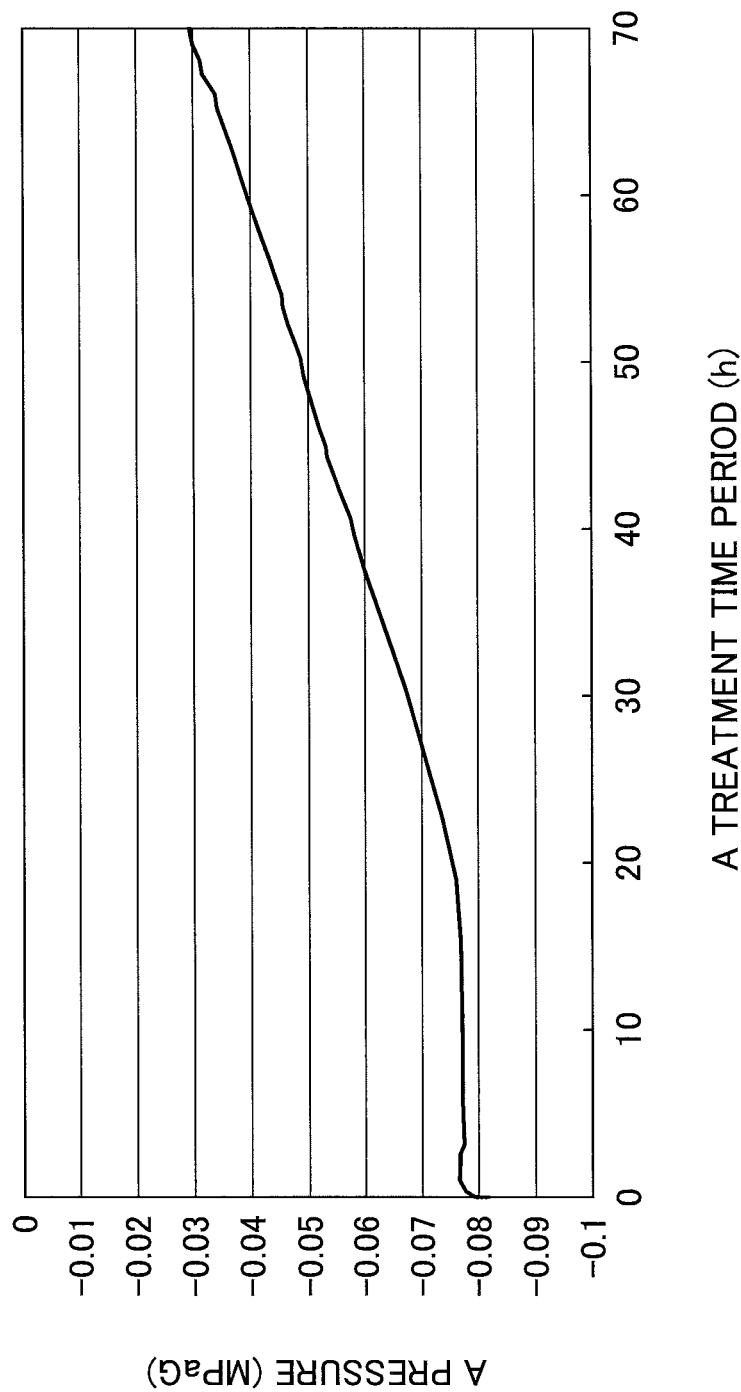
FIG. 15 is a schematic diagram for illustrating a relationship between a temperature and the efficiency of removal of an acetic acid and/or acetic anhydride component(s) in a film formation method according to the present embodiment.

FIG. 15 illustrates a schematic diagram for illustrating a relationship between a temperature and the efficiency of removal of an acetic acid and/or acetic anhydride in a film formation method according to the present embodiment. In FIG. 15, a horizontal axis indicates a period of time for removal of an acetic acid and/or acetic anhydride component(s) and a vertical axis indicates a pressure of the inside of the PMDA vaporizer 71b and illustrates data in a case where a treatment temperature is 180° C.

In a treatment of removal of an acetic acid and/or acetic anhydride component(s) at 180° C., a vapor pressure of a PMDA raw material was high. Accordingly, a sublimated PMDA raw material is cooled by and deposited on a pipe at a downstream side of the PMDA vaporizer 71b. Accordingly, it was considered that a pressure of the inside of the PMDA vaporizer 71b increased when increasing a period of time for treatment, as illustrated in FIG. 15.

From the result described above, it could be found that it was preferable for a temperature of the inside of the vaporizer at a time of removal of an acetic acid and/or acetic anhydride component(s) to be in a range of 120° C.-150° C. from a viewpoint of a balance between the efficiency of removal of the acetic acid and/or acetic anhydride component(s) and suppression of sublimation of this PMDA raw material.

[APPENDIX]

(A Film Formation Method and a Film Formation Apparatus)

An illustrative embodiment of the present invention relates to at least one of a film formation method and a film formation apparatus.

One object of an illustrative embodiment of the present invention may be to prevent a problem(s) as described above, and a film formation method is provided that is capable of supplying a raw material gas stably.

According to an illustrative embodiment of the present invention, a film formation method is provided wherein a plurality of raw material monomers are vaporized in respective corresponding vaporizers and supplied into a film formation apparatus so that an organic film is film-formed on a substrate due to vapor deposition polymerization and wherein the film formation method has an impurity removal process for removing an impurity from at least one raw material monomer among the plurality of raw material monomers before the vapor deposition method.

According to an illustrative embodiment of the present invention, it is possible to provide a film formation method capable of supplying a raw material gas stably.

Illustrative Embodiment (1) is a film formation method wherein a plurality of raw material monomers are vaporized in respective corresponding vaporizers and supplied into a film formation apparatus so that an organic film is film-formed on a substrate by vapor deposition polymerization, comprising an impurity removal process for removing an impurity in at least one raw material monomer among the plurality of raw material monomers before the vapor deposition polymerization.

Illustrative Embodiment (2) is the film formation method as described in Illustrative Embodiment (1), wherein the impurity removal process includes a process for volatilizing and removing the impurity.

Illustrative Embodiment (3) is the film formation method as described in Illustrative Embodiment (2), wherein the process for volatilizing and removing is conducted while an inert gas is supplied under a reduced pressure.

Illustrative Embodiment (4) is the film formation method as described in any one of Illustrative Embodiments (1) to (3), wherein the impurity removal process is conducted in the vaporizer that is filled with the raw material monomer with the impurity being removed therefrom.

Illustrative Embodiment (5) is the film formation method as described in any one of Illustrative Embodiments (1) to (4), wherein the organic film is an organic film selected from a group of a polyimide film, a polyurea film, a polyurethane film, and a polyazomethine film.

Illustrative Embodiment (6) is the film formation method as described in Illustrative Embodiment (5), wherein the organic film is a polyimide film provided by vapor-deposition-polymerizing an acid dianhydride and a diamine and the impurity is acetic acid and/or acetic anhydride in the acid dianhydride.

Illustrative Embodiment (7) is the film formation method as described in Illustrative Embodiment (6), wherein a concentration(s) of the acetic acid and/or the acetic anhydride is 400 ppm or less due to the impurity removal process.

Illustrative Embodiment (8) is the film formation method as described in Illustrative Embodiment (6) or (7), wherein the impurity removal process is conducted in a range of 120° C.-180° C.

Illustrative Embodiment (9) is the film formation method as described in any one of Illustrative Embodiments (1) to (7), including one tray or a plurality of trays arranged at a predetermined interval in a vertical direction, for mounting the raw material monomer, inside the vaporizer.

Illustrative Embodiment (10) is a film formation apparatus for film-forming a polyimide film on a silicon wafer by vapor-deposition-polymerizing an acid dianhydride and a diamine, wherein the film formation apparatus comprises a mounting part for mounting the silicon wafer thereon, a first vaporizer for mounting the acid dianhydride thereon, vaporizing the acid dianhydride and supplying the acid dianhydride to the mounting part, a second vaporizer for mounting the diamine thereon, vaporizing the diamine, and supplying the diamine to the mounting part, an inert gas supply part for supplying an inert gas to at least the first vaporizer, an exhaust gas part for exhausting a gas from at least the inside of the first vaporizer, and a control part for controlling operations of the first vaporizer, the second vaporizer, the inert gas supply part, and the exhaust gas part, wherein the control part controls the inert gas supply part to supply the inert gas to the first vaporizer with the acid dianhydride mounted thereon, controls the exhaust gas part to exhaust a gas from the inside of the first vaporizer to remove an acetic acid and/or acetic anhydride in the acid dianhydride inside the first vaporizer, and controls each of the first vaporizer and the second vaporizer to supply the acid dianhydride with the acetic acid and/or the acetic anhydride being removed therefrom, and the diamine mounted in the second vaporizer, to the mounting part.

Illustrative Embodiment (11) is the film formation apparatus as described in Illustrative Embodiment (10), wherein the acid dianhydride mounted in the first vaporizer is such that concentrations of aluminum, boron, calcium, cadmium, cobalt, chromium, copper, iron, potassium, lithium, magnesium, manganese, sodium, nickel, lead, antimony, titanium, vanadium, and zinc are 100 ppb or less.

Illustrative Embodiment (12) is the film formation apparatus as described in Illustrative Embodiment (10) or (11), wherein the control part controls the inert gas supply part and the exhaust gas part to remove the acetic acid and/or the acetic anhydride in the acid dianhydride so that a concentration(s) of the acetic acid and/or the acetic anhydride is/are 400 ppm or less.

Illustrative Embodiment (13) is the film formation apparatus as described in any one of Illustrative Embodiments (10) to (12), wherein the acid dianhydride is pyromellitic dianhydride and the diamine is 4,4'-oxydianiline.

Illustrative Embodiment (14) is the film formation apparatus as described in any one of Illustrative Embodiments (10) to (13), wherein a temperature of the first vaporizer at a time of removal of the acetic acid and/or the acetic anhydride is in a range of 120° C.-180° C.

Illustrative Embodiment (15) is the film formation apparatus as described in any one of Illustrative Embodiments (10) to (14), wherein a flow rate of the inert gas at a time of removal of the acetic acid and/or the acetic anhydride is in a range of $8.33 \times 10^{-7}$ m$^3$/s–$8.33 \times 10^{-6}$ m$^3$/s.

Illustrative Embodiment (16) is the film formation apparatus as described in any one of Illustrative Embodiments (10) to (15), wherein a pressure of the inside of the first vaporizer at a time of removal of the acetic acid and/or the acetic anhydride is in a range of $1.33 \times 10^4$ Pa–$2.66 \times 10^4$ Pa.

Illustrative Embodiment (17) is the film formation apparatus as described in any one of Illustrative Embodiments (10) to (16), including one tray or a plurality of trays arranged at a predetermined interval in a vertical direction, for mounting the acid dianhydride, inside the first vaporizer.

Illustrative Embodiment (18) is the film formation apparatus as described in any one of Illustrative Embodiments (10) to (17), wherein the mounting part has a boat for holding a plurality of the silicon wafers horizontally at a predetermined interval in upper and lower directions.

Although the illustrative embodiment(s) and specific example(s) of the present invention have been described with reference to the accompanying drawing(s), the present invention is not limited to any of the illustrative embodiment(s) and specific example(s), and the illustrative embodiment(s) and specific example(s) may be altered, modified, or combined without changing the essence of or departing from the scope of the present invention.

The present application claims the benefit of priority to Japanese Patent Application No. 2013-181383 filed on Sep. 2, 2013 in Japan, the entire content of which is herein incorporated by reference.

What is claimed is:
1. A film formation method, comprising:
vaporizing a plurality of raw material monomers in respective corresponding vaporizers;
supplying the plurality of raw material monomers via a plurality of supply tubes including a first supply tube and a second supply tube that is arranged inside the first supply tube into a film formation apparatus, said first and second supply tubes supplying different raw material monomers during the supplying step;
causing vapor deposition polymerization of the plurality of raw material monomers in the film formation apparatus to form an organic film on a substrate; and removing an impurity contained in at least one raw material monomer among the plurality of raw material monomers before the vapor deposition polymerization, wherein the removing of the impurity is conducted in the corresponding vaporizer filled with the raw material monomer containing the impurity while supplying an inert gas at a flow rate at a time of removal of the at least one of acetic acid and acetic anhydride is in a range of $8.33 \times 10^{-7}$ m$^3$/s to $8.33 \times 10^{-6}$ m$^3$/s into the corresponding vaporizer under a reduced pressure of $1.33 \times 10^4$ Pa~$2.66 \times 10^4$ Pa with a valve provided at a corresponding supply tube being closed, and wherein the removing of the impurity is performed when each of the plurality of raw material monomers is contained in a plurality of trays that are arranged at a predetermined interval in a vertical direction of the corresponding vaporizer.

2. The film formation method as claimed in claim 1, wherein the removing an impurity includes volatilizing the impurity.

3. The film formation method as claimed in claim 1, wherein the organic film is selected from the group consisting of a polyimide film, a polyurea film, a polyurethane film, and a polyazomethine film.

4. The film formation method as claimed in claim 3, wherein the organic film is a polyimide film, the plurality of raw material monomers are an acid dianhydride and a diamine, and the impurity is at least one of acetic acid and acetic anhydride contained in the acid dianhydride.

5. The film formation method as claimed in claim 4, wherein a concentration of the at least one of acetic acid and acetic anhydride in the acid dianhydride is 400 ppm or less after the removing of the impurities.

6. The film formation method as claimed in claim 4, wherein the removing an impurity is conducted at a temperature of 120° C. to 180° C.

7. The film formation method as claimed in claim 1, wherein the removing step removes at least one of acetic acid and acetic anhydride component.

8. The film formation method as claimed in claim 1, wherein the suppling step is performed via the first supply tube including a plurality of supply ports that are arranged at a downstream side relative to the second supply tube.

* * * * *